(12) United States Patent
Sumino et al.

(10) Patent No.: US 6,906,378 B2
(45) Date of Patent: Jun. 14, 2005

(54) NON-VOLATILE SEMICONDUCTOR MEMORY DEVICE AND METHOD OF FABRICATING THE SAME

(75) Inventors: Jun Sumino, Hyogo (JP); Satoshi Shimizu, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/612,913

(22) Filed: Jul. 7, 2003

(65) Prior Publication Data

US 2004/0145007 A1 Jul. 29, 2004

(30) Foreign Application Priority Data

Jan. 24, 2003 (JP) .................................... 2003-016107

(51) Int. Cl.⁷ .......................................... H01L 29/788
(52) U.S. Cl. ...................................... 257/315; 257/374
(58) Field of Search ................................ 257/315, 374

(56) References Cited

U.S. PATENT DOCUMENTS 5,994,733 A * 11/1999 Nishioka et al. ............ 257/316
6,413,836 B1 * 7/2002 Tseng ......................... 438/424
6,555,427 B1 * 4/2003 Shimizu et al. ............. 438/238

FOREIGN PATENT DOCUMENTS

JP 08-64700 3/1996
JP P2001-284556 A 10/2001

* cited by examiner

*Primary Examiner*—David Nelms
*Assistant Examiner*—Tu-Tu Ho
(74) *Attorney, Agent, or Firm*—McDermott Will & Emery LLP

(57) ABSTRACT

There is provided a non-volatile semiconductor memory device exhibiting excellent electrical characteristics and a method of fabricating the same. The semiconductor device includes a semiconductor substrate having two trenches, an isolation oxide film provided in the trench, a floating gate electrode, an ONO film, and a control gate electrode. The isolation oxide film has an upper surface with a region having a curvature protruding downward. The floating gate electrode has a flat upper surface and extends from a main surface of the semiconductor substrate between the two trenches to the two isolation oxide films. The ONO film extends from the upper surface of the floating gate electrode to a side surface of the floating gate electrode. The control gate electrode is provided on the ONO film to extend from the upper surface of the floating gate electrode to the side surface of the floating gate electrode.

4 Claims, 26 Drawing Sheets

NON-VOLATILE SEMICONDUCTOR MEMORY DEVICE AND METHOD OF FABRICATING THE SAME

BACKGROUND OF THE INVENTION

1. Field of the Invention

The present invention relates generally to non-volatile semiconductor memory devices and methods of fabricating the same and particularly to non-volatile semiconductor memory devices capable of providing improved electrical characteristics and methods of fabricating the same.

2. Description of the Background Art

Conventionally as one example of semiconductor devices non-volatile semiconductor memory devices have been known (see Japanese Patent Laying-Open No. 8-64700 for example).

Japanese Patent Laying-Open No. 8-64700 discloses in FIG. 3 a non-volatile semiconductor memory device including a semiconductor substrate having a main surface with predeterminedly spaced device isolating trenches internally provided with CVD oxide film forming an isolation oxide film. Between such isolation oxide films on the substrate's main surface a floating gate electrode is disposed with a tunnel oxide film posed therebetween. On the floating gate electrode a control gate electrode is disposed with an ONO film posed therebetween.

In the above conventional non-volatile semiconductor memory device, however, the floating gate electrode has an upper surface having a protrusion and a depression reflecting a feature underlying the floating gate electrode. As such at the protrusion of the floating gate electrode (e.g., an end of the floating gate electrode) the ONO film can differ in thickness, quality and the like from the remainder or electric field concentration can occur. This results in the device having impaired electrical characteristics.

SUMMARY OF THE INVENTION

The present invention contemplates a non-volatile semiconductor memory device exhibiting excellent electrical characteristics and a method of fabricating the same.

The present non-volatile semiconductor memory device includes a semiconductor substrate, an isolation insulator, a floating electrode, an insulation film, and a control gate. The semiconductor substrate has a main surface provided with two spaced trenches. The isolation insulator fills the trench and has an upper surface with an end having a curvature protruding toward the semiconductor substrate. The floating electrode has a flat surface and extends from a main surface of the semiconductor substrate between the two trenches to the two isolation insulators. The insulation film extends from an upper surface of the floating electrode to a side surface of the floating gate overlying the isolation insulator. The control gate is disposed on the insulation film to extend from an upper surface of the floating electrode to a side surface of the floating electrode.

Thus the insulation film can be disposed on a flat upper surface of the floating electrode. With the floating electrode having an upper surface free of protrusions and depressions, the insulation film can be free from local variation in thickness, characteristics and the like. With the insulation film free of variation for example in thickness, local electric field concentration can be reduced between the control electrode and the floating electrode. The reduced electrical field concentration can contribute to less impaired electrical characteristics of the semiconductor device. Furthermore, the isolation insulator having an upper surface with an end having a curvature protruding toward the semiconductor substrate, can prevent the floating electrode from having a lower portion with a protrusion having an apex of an acute angle. As a result, highly reliable and long-life semiconductor device can be implemented.

The present semiconductor device fabrication method includes the steps of: providing a semiconductor substrate at a main surface with two spaced trenches; providing in the trench an isolation insulator having a protrusion protruding upper than a main surface of the semiconductor substrate; and isotropically etching away the protrusion partially to reduce the protrusion to be smaller in thickness than the trench. Furthermore the method includes the steps of: after the step of isotropically etching, providing the semiconductor substrate at a main surface with a conductor film extending from a region located between the two isolation insulators to the isolation insulator; removing an upper surface layer of the conductor film to expose an upper portion of the isolation insulator to provide a floating electrode formed of the conductor film, having a flat upper surface and located between the isolation insulators; and etching away an upper portion of the isolation insulator adjacent to the floating electrode to expose a side surface of the floating electrode.

Thus photolithography can be dispensed with in providing a floating electrode between isolation insulators. Without photolithography, mask misalignment or the like is not introduced, and the floating electrode can be provided precisely in position as designed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
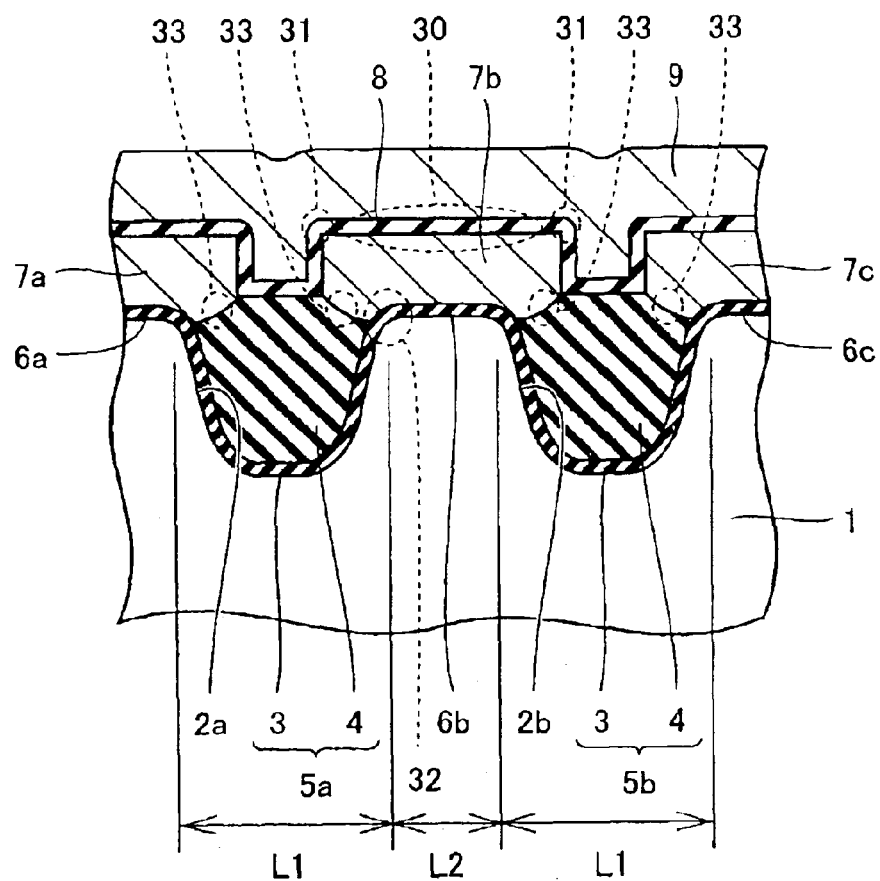
FIG. 1 is a schematic cross section of the present semiconductor device in a first embodiment.

Hereinafter with reference to the drawings the present invention will be described in embodiments. Throughout the figures, like components are denoted by like reference characters.

First Embodiment

Reference will first be made to FIG. 1 to describe the present semiconductor device in a first embodiment.

As shown in FIG. 1, the present semiconductor device is a semiconductor memory device including a semiconductor substrate 1 having a main surface having a device formation region surrounded by an isolation oxide film. The semiconductor device in the device formation region includes spaced, conductive impurity diffusion regions (not shown) and in a region located between conductive impurity diffusion regions has a tunnel insulation film 6a–6c overlying a main surface of semiconductor substrate 1, a floating gate electrode 7a–7c overlying the tunnel insulation film, an ONO film 8 overlying floating gate electrode 7a–7c, and a control gate electrode 9 overlying ONO film 8. The FIG. 1 semiconductor device is a non-volatile semiconductor memory device (so-called flash memory).

More specifically, as shown in FIG. 1, semiconductor substrate 1 has a main surface provided with a trench 2a, 2b surrounding the device formation region. On the trench 2a, 2b internal wall surface an oxide film 3 is disposed. On oxide film 3 trench 2a, 2b is filled with a high density plasma-chemical vapor deposition (HDP-CVD) oxide film 4. Oxide film 3 and HDP-CVD oxide film 4 form an isolation oxide film 5a, 5b. Isolation oxide film 5a, 5b has an upper surface having an end 33 curved to protrude downward (or toward semiconductor substrate 1).

On the semiconductor substrate 1 main surface in the device formation region tunnel insulation film 6a–6c is provided. Floating gate electrode 7a–7c extends from tunnel insulation film 6a–6c to an end 33 of isolation oxide film 5a, 5b. On floating gate electrode 7a–7c insulative ONO film 8 is disposed. ONO film 8 is a film formed of a stack of the three insulation film layers of an oxide film, a nitride film and an oxide film, as seen from floating gate electrode 7a–7c. ONO film 8 extends from an upper surface of floating gate electrode 7a–7c to a side surface of the electrode. Furthermore, ONO film 8 also extends from a side surface of floating gate electrode 7a–7c to a portion of an upper surface of isolation oxide film 5a, 5b.

Floating gate electrode 7a–7c has an upper surface planarized to extend in a direction substantially parallel to the main surface of semiconductor substrate 1. The floating gate electrode 7a–7c upper surface has an end having a corner 31 having an apex of approximately 90°. On ONO film 8 control gate electrode 9 is disposed. Control gate electrode 9 extends from an upper surface of floating gate electrode 7a–7c to a side surface of floating gate electrode 7a–7c. Note that isolation oxide film 5a, 5b may have a width L1 for example of 200 nm and between isolation oxide films 5a and 5b the device formation region may have a width L2 for example of 100 nm.

The above-described, present semiconductor device in one example has a characteristic configuration summarized as follows: the FIG. 1 semiconductor device is a non-volatile semiconductor memory device including semiconductor substrate 1, isolation oxide film 5a, 5b serving as an isolating insulator, floating gate electrode 7a–7c serving as a floating electrode, ONO film 8 serving as an insulation film, and control gate electrode 9 serving as a control electrode. Semiconductor substrate 1 has a main surface having two spaced trenches 2a and 2b. Isolating insulation film 5a, 5b fills trench 2a, 2b. Isolating insulation film 5a, 5b has an upper surface having an end region 33 curved to protrude toward semiconductor substrate 1 (downward). Floating gate electrode 7b extends from between two trenches 2a and 2b on a main surface of semiconductor substrate 1 to two isolation oxide films 5a, 5b. Floating gate electrode 7a–7c has a flat upper surface. ONO film 8 extends from an upper surface of floating gate electrode 7a–7c to a side surface of floating gate electrode 7a–7c located on isolation oxide film 5a, 5b. Control gate electrode 9 overlies ONO film 8 to extend from an upper surface of floating gate electrode 7a–7c to a side surface of floating gate electrode 7a–7c.

Thus ONO film 8 can overlie a flat upper surface of floating gate electrode 7a–7c. With floating gate electrode 7a–7c having an upper surface free of protrusions and depressions, the insulative ONO film 8 can be free of local variation in thickness, characteristics and the like. This can for example address a conventional problem caused at a portion corresponding to region 30 shown in FIG. 1: ONO film 8 free of variation for example in thickness can contribute to reduced local electrical field concentration occurring between control gate electrode 9 and floating gate electrode 7a–7c. The reduced local electrical field concentration can in turn contribute to less impaired electrical characteristics of the semiconductor device. As a result, the semiconductor device can be highly reliable and have a long life.

Furthermore, floating gate electrode 7a–7c that extends to reach isolation oxide film 5a, 5b can have an increased surface area opposite control gate electrode 9. Furthermore, arranging control gate electrode 9 extending from an upper surface of floating gate electrode 7a–7c to a side surface of floating gate electrode 7a–7c with ONO film 8 posed therebetween can increase a capacitance (C1) between control gate electrode 9 and floating gate electrode 7a–7c and accordingly, a coupling ratio ($\alpha$) proportional to capacitance (C1) provided between control gate electrode 9 and floating gate electrode 7a–7c.

Herein, coupling ratio ($\alpha$) is represented by $\alpha=C1/(C1+C2)$, wherein C2 represents a capacitance between floating gate electrode 7a–7c and semiconductor substrate 1, and C1 represents a capacitance between control gate electrode 9 and floating gate electrode 7a–7c, as described above. Increasing coupling ratio ($\alpha$) can decrease a voltage of a signal applied to control gate electrode 9. The present semiconductor device can thus reduce a voltage of a signal applied to control gate electrode 9.

Furthermore in the FIG. 1 semiconductor device a sidewall surface of trench 2a, 2b and a main surface of semiconductor substrate 1 that underlies floating gate electrode 7a–7c may be connected at a portion (connection 32) allowing semiconductor substrate 1 to have a curved surface. Such a connection 32 has an effect, as will be described hereinafter with reference to FIGS. 47 and 48.

Figure 47:
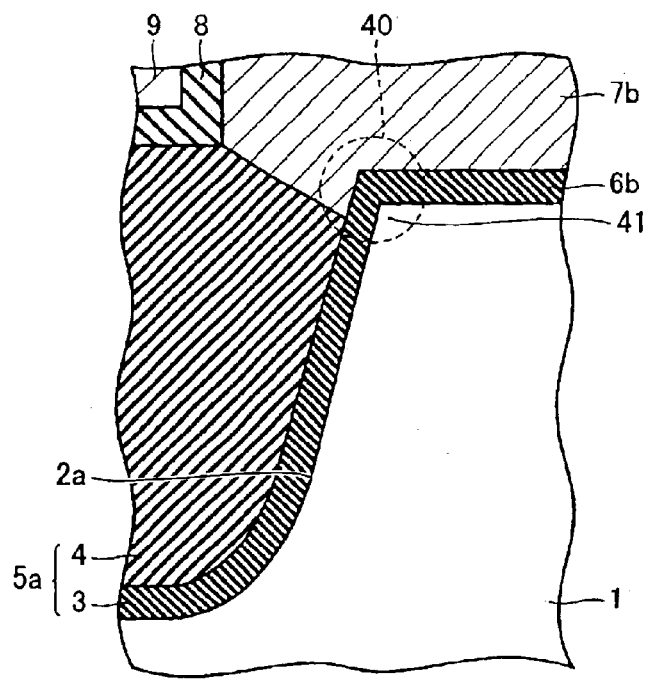
FIGS. 47–49 are reference diagrams for illustrating an effect of the FIG. 1 semiconductor device.
Figure 48:
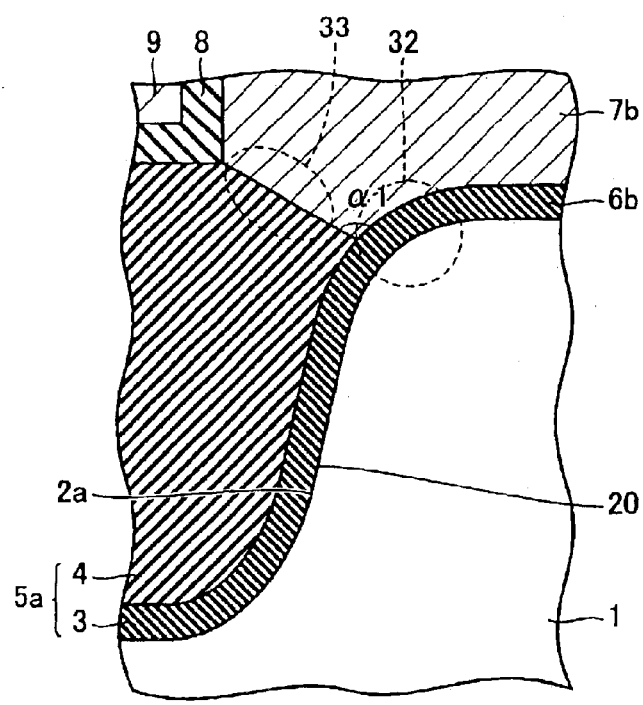

As shown in FIG. 47, if a main surface of substrate 1 underlying floating gate 7b and a sidewall surface of trench 2a are connected at a portion (connection 40), pointed as indicated by a numeral 41 (i.e., connection 40 is not rounded) then at connection 40 insulation between floating gate electrode 7b and semiconductor substrate 1 reduces. This is because at pointed portion 41 (an angled portion) electric field concentration occurs. In contrast, FIG. 48 shows that at a connection 32 semiconductor substrate 1 has a rounded surface (i.e., such as shown in the FIG. 1 semiconductor device). This provides for a reduced possibility of connection 32 having electric field concentration, and hence improved insulation between floating gate electrode 7b and semiconductor substrate 1.

Figure 49:
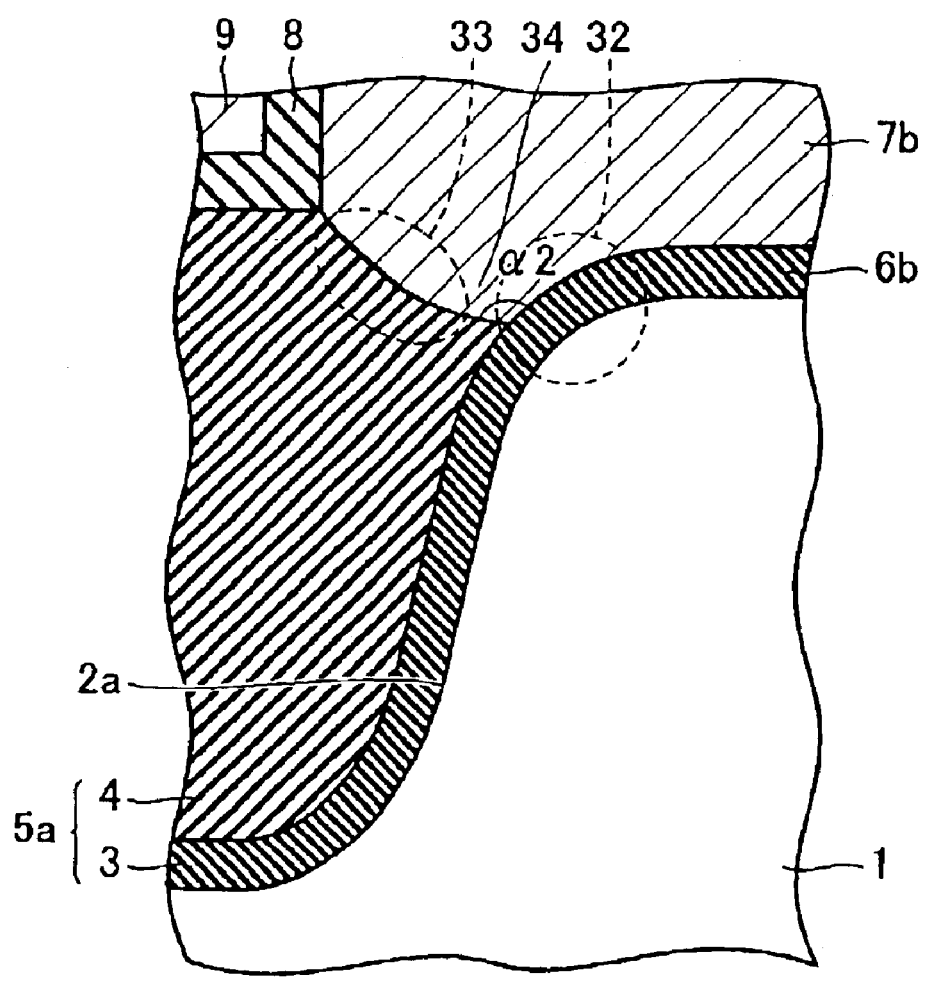

Furthermore, as shown in FIG. 49, the present semiconductor device includes insulation oxide film 5a having an upper surface with end region 33 curved to protrude toward semiconductor substrate 1 (i.e., downward). Note that FIG. 49 is a schematic, partially enlarged diagram of FIG. 1.

As shown in FIG. 49, the present semiconductor device, including isolation oxide film 5a having an upper surface with end regions 33 curved to protrude downward, allows an upper surface of HDP-CVD oxide film 4, a constituent of isolation oxide film 5a, and an upper surface of tunnel insulation film 6b to form an angle $\alpha 2$ larger than an angle $\alpha 1$ formed by upper surfaces of HDP-CVD oxide film 4 and tunnel insulation film 6b, respectively, in the FIG. 48 semiconductor device. Note that in the FIG. 48 semiconductor device HDP-CVD oxide film 4 has an upper surface with end region 33 substantially linear as seen in cross section. That is, as shown in FIG. 49, region 33 that is curved to protrude downward, allows an upper surface of HDP-CVD oxide film 4 and that of tunnel insulation film 6b to form large angle $\alpha 2$. As such in a vicinity of connection 32 floating gate electrode 7b has a bottom protrusion 34 having an obtuse apex (angle $\alpha 2$), rather than an acute angle. At protrusion 34 having an apex of an obtuse angle, electric field concentration can be reduced (i.e., tunnel insulation film 6b can be enhanced in insulation). The semiconductor device can thus be prevented from having reduced reliability and shorter longevity attributed to electric field concentration.

The FIG. 1 semiconductor device (a non-volatile semiconductor memory device) is fabricated, as will be described hereinafter with reference to FIGS. 2–8.

Figure 2:
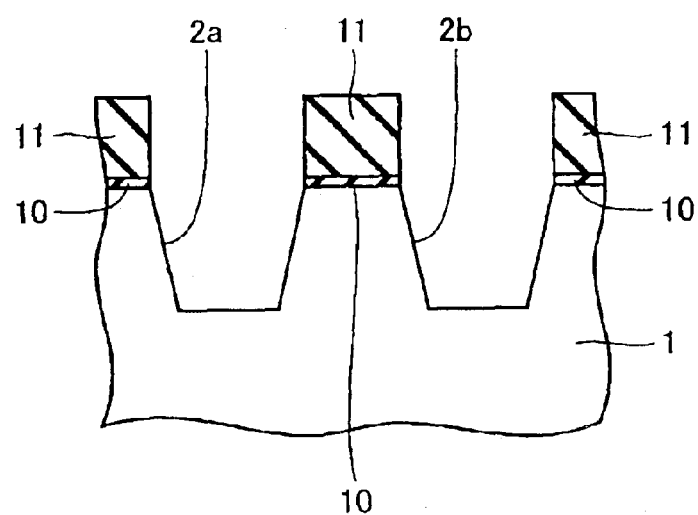
FIGS. 2–8 illustrate first to seventh steps, respectively, of a method of fabricating the FIG. 1 semiconductor device.

Initially on a main surface of semiconductor substrate 1 a silicon oxide film (not shown) is disposed. On the silicon oxide film a silicon nitride film (not shown) is disposed. On the silicon nitride and oxide films photolithography is employed to provide a patterned resist film. This resist film is used as a mask in partially etching the silicon nitride and oxide films away. The resist pattern is then removed. Semiconductor substrate 1 thus has a main surface with patterned silicon oxide and nitride films 10 and 11 thereon (see FIG. 2). Silicon oxide and nitride films 10 and 11 are used as a mask in partially dry-etching semiconductor substrate 1 away. Alternatively, the substrate may be subjected to anisotropic etching other than dry etching. Semiconductor substrate 1 thus has a main surface provided with two spaced trenches 2a and 2b (as shown in FIG. 2.)

Figure 3:
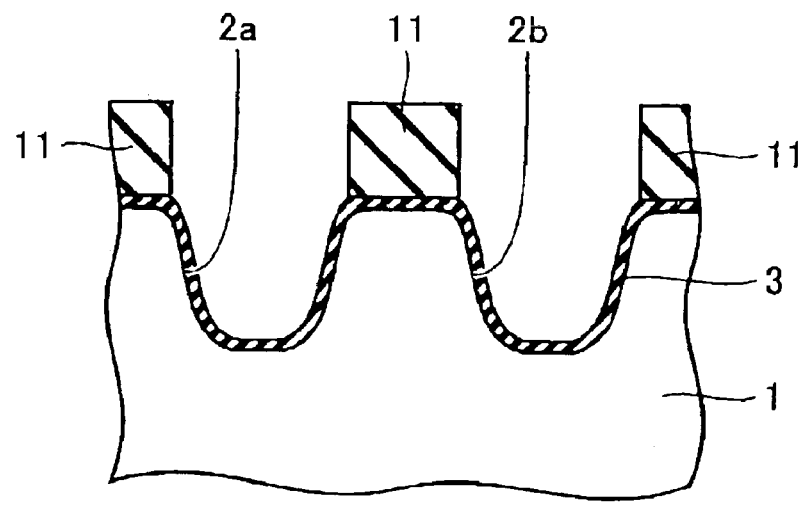

Trench 2a, 2b then has an internal wall surface thermally oxidized to provide oxide film 3 (see FIG. 3). The structure shown in FIG. 3 is thus obtained. Note that oxide film 3 is introduced to alleviate etching-stress in semiconductor substrate 1.

Figure 4:
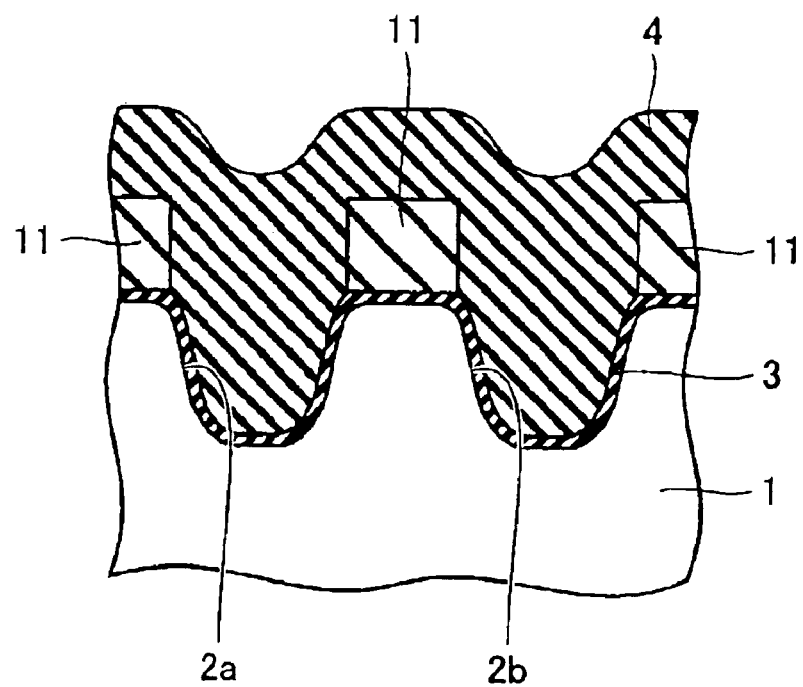

Then, as shown in FIG. 4, on oxide film 3 trench 2a, 2b is filled with HDP-CVD oxide film 4. HDP-CVD oxide film 4 is disposed to fill trench 2a, 2b and also extend to an upper surface of silicon nitride film 11.

Figure 5:
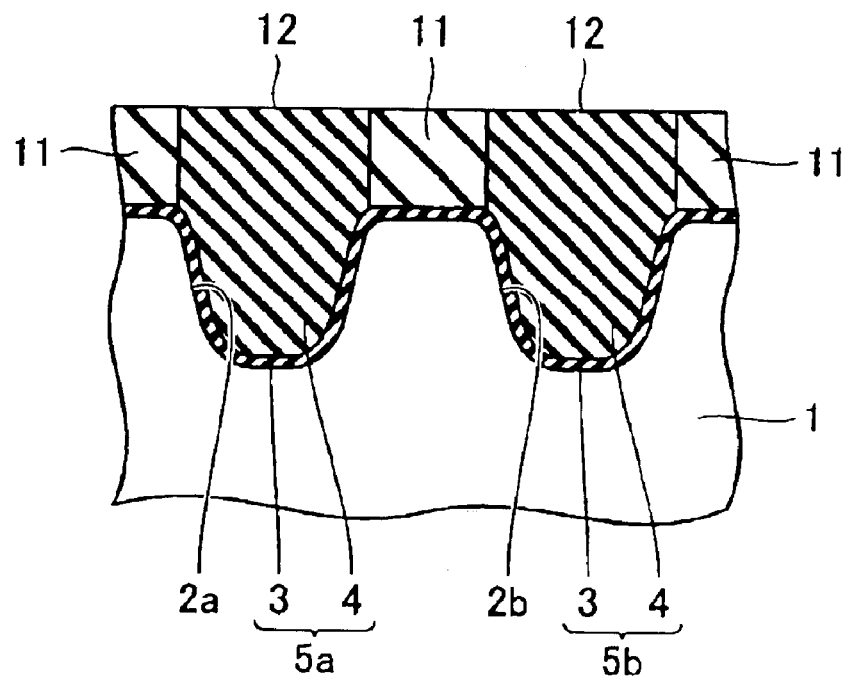

Chemical mechanical polishing (CMP) is then employed to remove a portion of HDP-CVD oxide film 4 overlying an upper surface of silicon nitride film 11 and also planarize an upper surface 12 of HDP-CVD oxide film 4 (see FIG. 5). Alternatively the CMP is replaced with a different planarization process. As a result, isolation oxide film 5a, 5b formed of HDP-CVD oxide film 4 an oxide film 3 can be obtained (FIG. 5). Thus, forming in trench 2a, 2b a portion protruding upper than a main surface of semiconductor substrate 1 provides the structure shown in FIG. 5.

Figure 6:
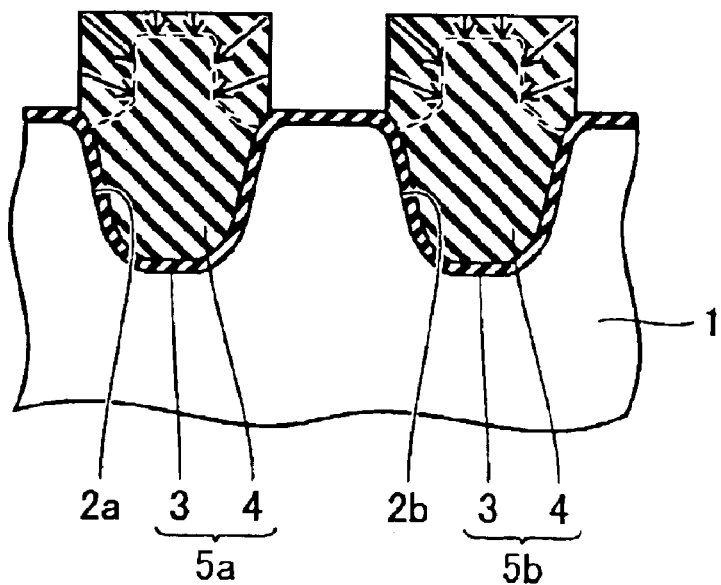

Wet-etching is then employed to remove silicon nitride film 11 (see FIG. 5). In this wet etching, thermal phosphoric acid or the like can be used as etchant. Then as an etchant hydrogen fluoride or the like is employed to isotropically etch away an upper portion of HDP-CVD oxide film 4 and oxide film 3 overlying a main surface of semiconductor substrate 1 (see FIG. 5), as shown in FIG. 6. Consequently, as indicated in FIG. 6 by a broken line, isolation oxide film 5a, 5b has an upper portion partially removed. This isotropic etching allows isolation oxide film 5a, 5b to have an upper center portion protruding on a main surface of semiconductor substrate 1. This isotropic etching also exposes a main surface of semiconductor substrate 1 in the device formation region. Thus by isotropically etching an upper, protruding portion of isolation oxide film 5a, 5b to partially remove it, the width of protrusion is reduced to be smaller than that of trench 2a, 2b.

Then, on a main surface of semiconductor substrate 1 in the device formation region, tunnel insulation film 6a–6c (see FIG. 7) is provided. A polysilicon film 14 serving as a conductive film (see FIG. 7) is disposed to extend from tunnel insulation film 6a–6c to isolation oxide film 5a, 5b. Thus the step of reducing the width of a protrusion of isolation oxide film 5a, 5b to be smaller than that of trench 2a, 2b is followed by the step of disposing conductive, polysilicon film 14 extending from a region of a main surface of semiconductor substrate 1 located between two isolation oxide films 5a and 5b to isolation oxide film 5a, 5b.

Figure 7:
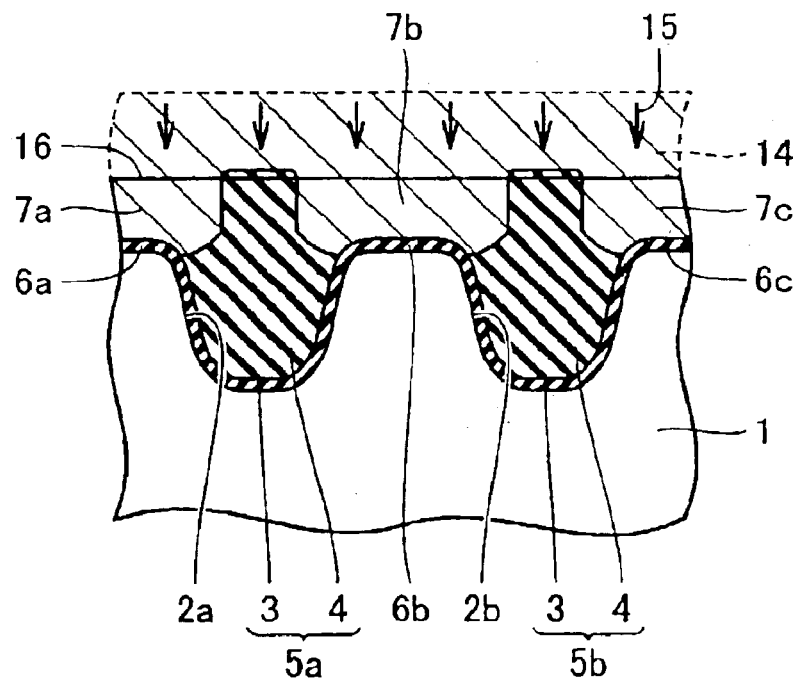

Polysilicon film 14 then has an upper surface layer chemically mechanically polished or subjected to a similar planarization process to have a portion removed. As a result, as shown in FIG. 7, polysilicon film 14 has an upper surface 16 receding, as indicated by an arrow 15, to expose an upper surface of isolation oxide film 5a, 5b. Floating gate electrodes 7a–7c separated by isolation oxide films 5a and 5b can thus be obtained. Conductive polysilicon film 14 thus has an upper surface layer removed to expose an upper portion of isolation oxide film 5a, 5b to form floating gate electrode 7b formed of polysilicon film 14, having a flat upper surface and also located between isolation oxide films 5a and 5b. Note that polysilicon film 14 may be replaced with amorphous silicon film.

Figure 8:
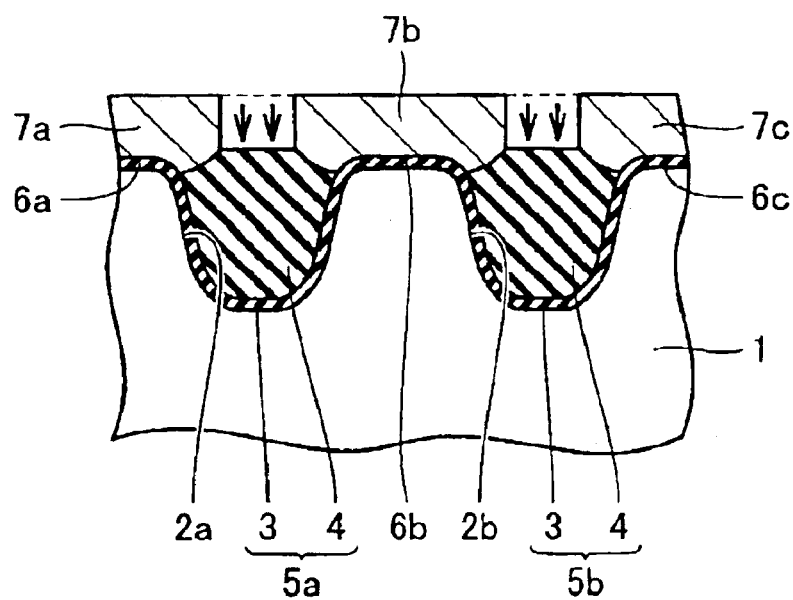

Then between floating gate electrodes 7a–7c isolation oxide film 5a, 5b has an upper portion isotropically etched away. It can be etched away with an etchant for example of hydrogen fluoride. As a result, as shown in FIG. 8, floating gate electrode 7a–7c can have an exposed side surface. Thus an upper portion of isolation oxide film 5a, 5b that is adjacent to floating gate electrode 7a–7c is etched away to provide floating gate electrode 7a–7c with an exposed side surface.

ONO film 8 is then provided to extend from upper and side surfaces of floating gate electrode 7a–7c to an upper surface of isolation oxide film 5a, 5b (see FIG. 1). Then on ONO film 8 control gate electrode 9 (see FIG. 1) is disposed. As a result can be obtained a flash memory serving as a semiconductor device structured as shown in FIG. 1.

In the FIGS. 2–8 semiconductor device fabrication method, photolithography can be dispensed with and between isolation oxide films 5a and 5b floating gate electrode 7a–7c can be formed in self alignment. Dispensing with photolithography and hence absence of mask misalignment allows floating gate electrode 7a–7c to be more precisely positioned as designed. It can also help to form floating gate electrode 7a–7c having a flat upper surface.

Furthermore, isolation oxide film 5a, 5b having a protrusion smaller in width than trench 2a, 2b allows floating gate electrode 7a–7c between isolation oxide films 5a and 5b to have an end overlying isolation oxide film 5a, 5b. This can help floating gate electrode 7a–7c to have a width larger than that between trenches 2a and 2b. Furthermore, as shown in FIG. 8, isolation oxide film 5a, 5b has an upper portion removed to allow floating gate electrode 7a–7c to have an exposed side surface. This allows control gate electrode 9 to extend from an upper surface of floating gate electrode 7a–7c to the side surface thereof with ONO film 8 posed therebetween. This can in turn increase capacitance (C1) between control gate electrode 9 and floating gate electrode 7a–7c. Consequently, coupling ratio ($\alpha$) can be increased and the flash memory can operate with enhanced characteristics.

Second Embodiment

Figure 9:
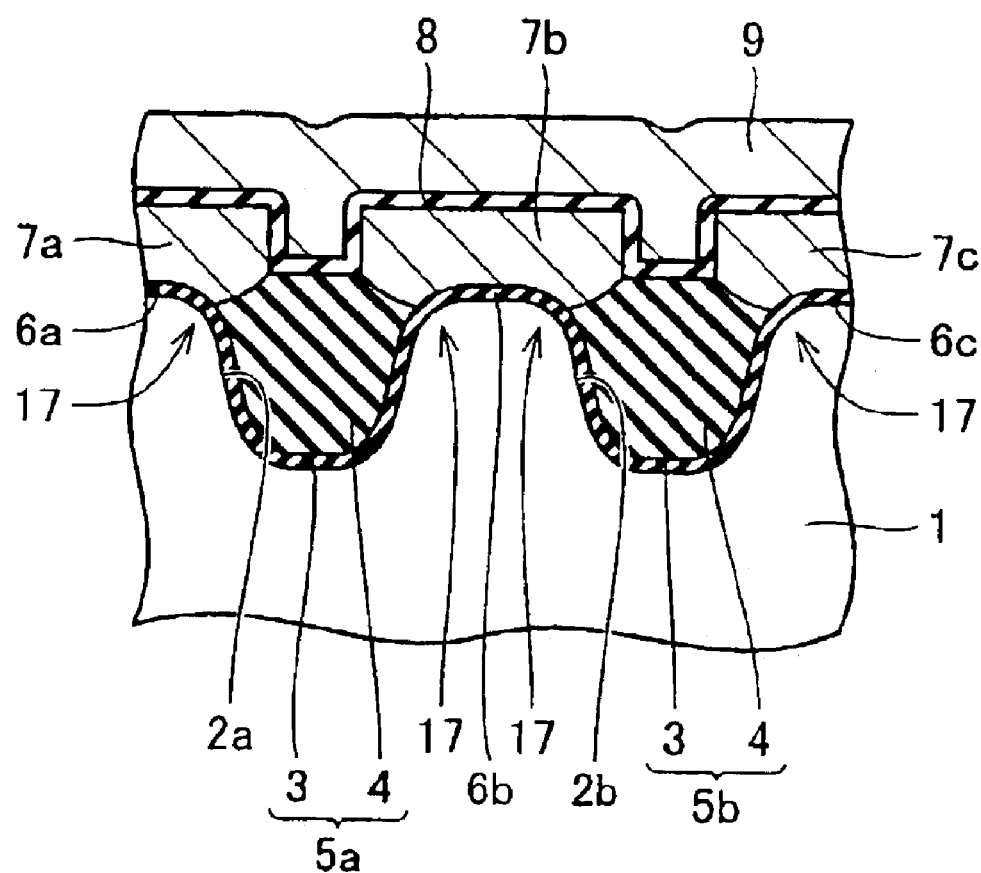
FIG. 9 is a schematic cross section of the present semiconductor device in a second embodiment.
Figure 10:
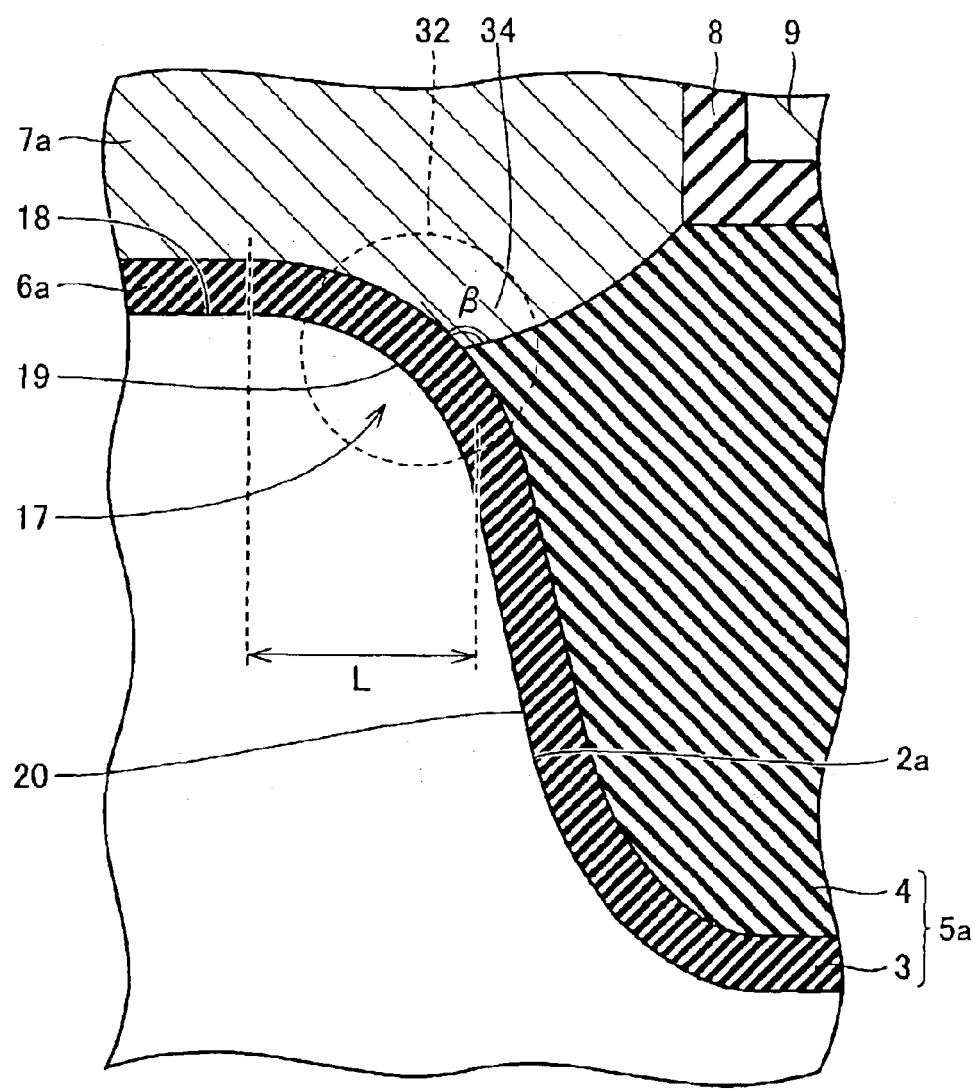
FIG. 10 is a partially enlarged, schematic cross section of the FIG. 9 semiconductor device.

With reference to FIGS. 9 and 10 the present semiconductor device in a second embodiment will be described. Note that FIG. 9 corresponds to FIG. 1.

The FIGS. 9 and 10 semiconductor device is basically similar in structure to the FIG. 1 semiconductor device, except the geometry of a boundary between isolation oxide film 5a, 5b and a device formation region of semiconductor substrate 1, i.e., the geometry of an upper portion (an edge 17) of trench 2a, 2b. Edge 17 has a geometry, as will more specifically be described hereinafter with reference to FIG. 10.

As shown in FIG. 10, isolation oxide film 5a has an end, or edge 17, defined by a curved portion 19 providing a curvature connecting together a flat portion 18 defining a main surface of semiconductor substrate 1 and a liner portion 20 defining a side surface of trench 2a. Note that liner portion 20 is a substantially linear portion of the side surface of trench 2a, as seen in a cross section of trench 2a in a direction substantially perpendicular to the main surface of semiconductor substrate 1. Curved portion 19 has a width L of 5 to 40 nm, more preferably 10 to 30 nm.

As shown in FIGS. 9 and 10, the present semiconductor device in one example is characterized in configuration summarized as follows: the semiconductor device is a non-volatile semiconductor memory device having the FIG. 1 semiconductor memory device's characteristic configuration plus connection 32 between a sidewall surface of trench 2a, 2b and a main surface of semiconductor substrate 1 underlying floating gate electrode 7a–7c that allows semiconductor substrate 1 to have a surface having a larger curvature.

The semiconductor device thus configured can be as effective as the FIG. 1 semiconductor device and also more reliably prevent floating gate electrode 7a–7c from having a lower surface with protrusion 34 located on connection 32 and having an acute apex $\beta$. As such, protrusion 34 can be free from significant electric field concentration, which further ensures that the semiconductor device is free from impaired reliability and reduced lifetime attributed to electric field concentration.

Furthermore, in the FIGS. 9 and 10 semiconductor device, curved portion 19, a portion of a surface of semiconductor substrate 1, curved as has been described above, has a width L of 5 to 40 nm as seen in a direction in which the semiconductor substrate 1 main surface extends.

Curved portion 19 having width L numerically ranging as described above allows a flat main surface of semiconductor substrate 1 at a portion adjacent to trench 2a, 2b and also allows a sidewall surface of trench 2a, 2b and a main surface of semiconductor substrate 1 to be connected 32 with a sufficiently smooth curvature.

With reference to FIGS. 11–17, the FIGS. 9 and 10 semiconductor device (a non-volatile semiconductor device) is fabricated, as described hereinafter.

Initially on a main surface of semiconductor substrate 1 (see FIG. 11) a silicon oxide film (not shown) is disposed. On the silicon oxide film a polysilicon film (not shown) is disposed. The polysilicon film can have a thickness for example of no more than 40 nm. Furthermore, the polysilicon film's thickness is preferably 10 to 30 nm, more preferably 15 to 25 nm. On the polysilicon film a silicon nitride film (not shown) is disposed. The polysilicon film may be replaced with amorphous silicon film.

On the silicon nitride film a patterned resist film is disposed. The resist film is used as a mask in partially removing the silicon nitride film, the polysilicon film and the silicon oxide film. The resist film is then removed. As a result, semiconductor substrate 1 has a main surface underlying a film formed of a stack of silicon oxide film 10, polysilicon film 21 and silicon nitride film 11 having an open pattern and serving as a mask layer. Thus on a main surface of semiconductor substrate a mask layer is formed that is formed of a film formed of stacked layers including polysilicon film 21 serving as a buffer conductive film layer and has an open pattern on a region to be provided with two trenches 2a, 2b. Polysilicon film 21 is partially exposed at a side surface opposite to the open pattern.

Figure 11:
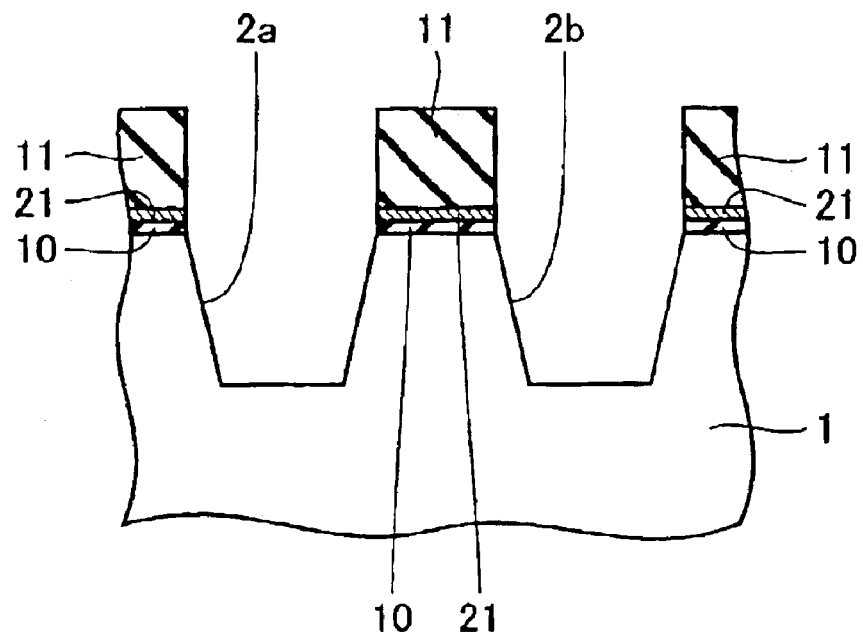
FIGS. 11–17 are schematic cross sections for illustrating first to seventh steps, respectively, of a method of fabricating the semiconductor device shown in FIGS. 9 and 10.

The film formed of stacked layers is used as a mask in anisotropically etching away a main surface of semiconductor substrate 1 partially. As a result semiconductor substrate 1 has a main surface provided with two trenches 2a, 2b (see FIG. 11). The structure shown in FIG. 11 is thus obtained.

Figure 12:
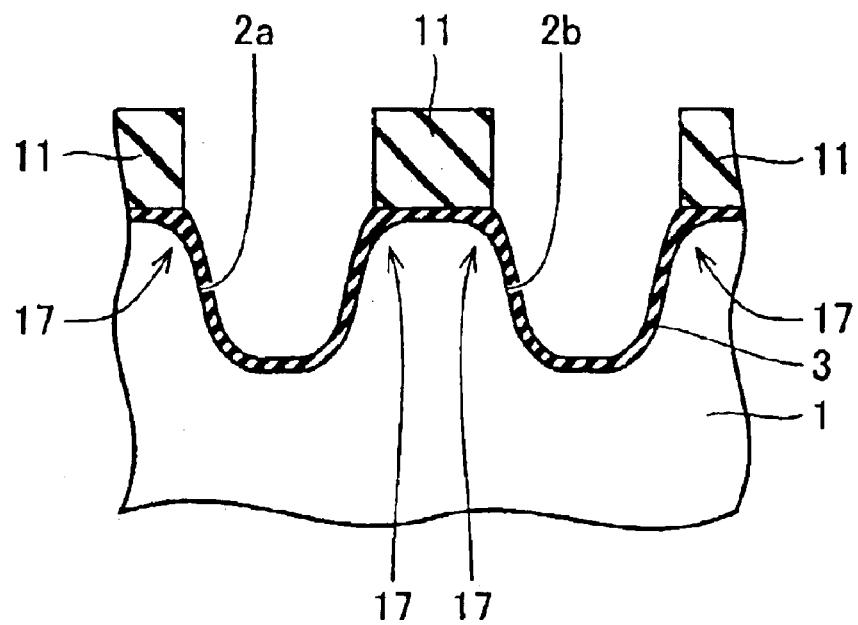

Then, similarly as described in the FIG. 3 step, trench 2a, 2b has an internal wall surface thermally oxidized to provide oxide film 3 (FIG. 12) serving as a first oxide film. The thermal oxidization step performed to provide the first oxide film also similarly oxidizes an end of polysilicon film 21 that faces trench 2a, 2b (FIG. 11). Consequently, as shown in FIG. 12, at edge 17, located at an upper portion of trench 2a, 2b, in an interface between semiconductor substrate 1 and silicon nitride film 11, silicon oxide film extends inward from an end facing trench 2a, 2b and a so-called bird's beak is formed. This bird's beak results in curved edge 17 of a surface of semiconductor substrate 1 in contact with oxide film 3.

Figure 13:
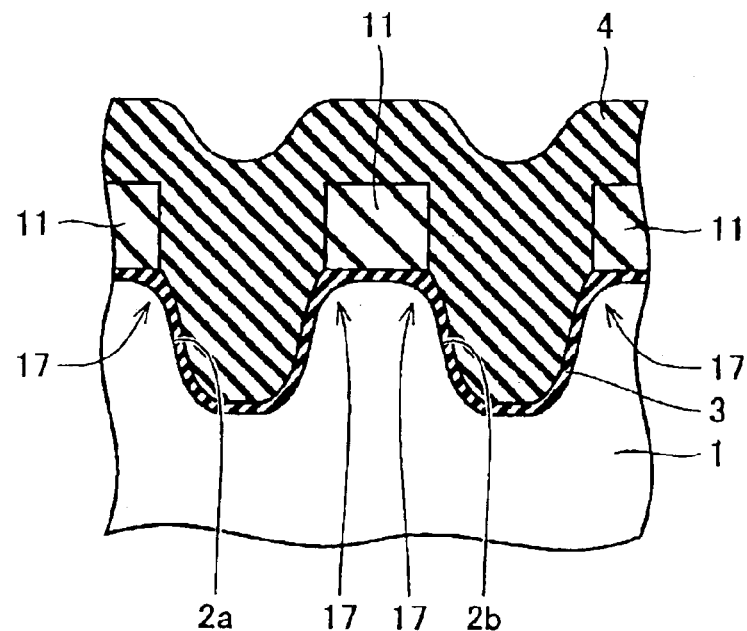
Figure 14:
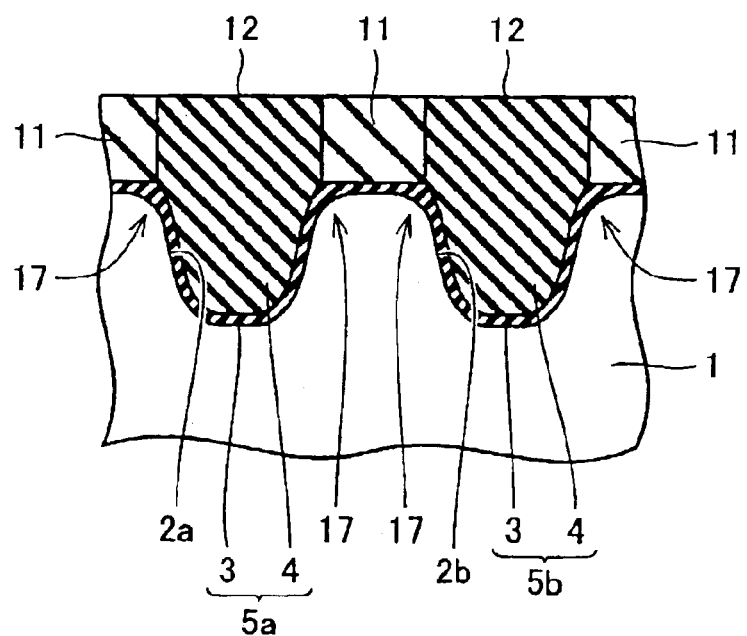

Then, similarly as described in the FIG. 4 step, trench 2a, 2b is filled. More specifically, on oxide film 3 HDP-CVD oxide film 4 serving as a second oxide film (see FIG. 13) is disposed. HDP-CVD oxide film 4 filling trench 2a; 2b also extends to an upper surface of silicon nitride film 11. As a result, the structure shown in FIG. 13 is obtained.

Then, similarly as described in the FIG. 5 step, HDP-CVD oxide film 4 (FIG. 13) is for example chemically mechanically polished to have an upper surface layer removed. As a result, a portion of HDP-CVD oxide film 4 overlying an upper surface of silicon nitride film 11 is removed and HDP-CVD oxide film 4 also has a flat upper surface 12 (see FIG. 14). The FIG. 14 structure is thus obtained.

Wet-etching is then employed to remove silicon nitride film 11 (FIG. 14) and the remaining polysilicon film 21

Figure 15:
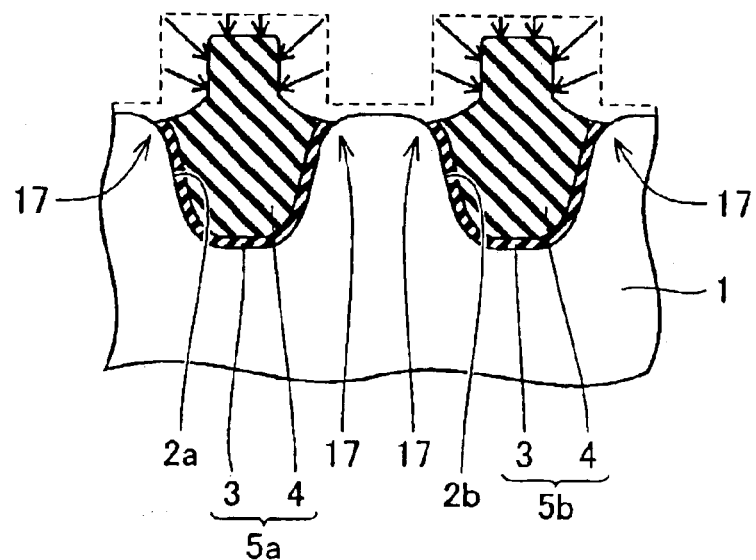

(FIG. 11). An etchant such as hydrofluoric acid is then used to isotropically etch away an upper portion of isolation oxide film 5a, 5b. As a result, as shown in FIG. 15, isolation oxide film 5a, 5b, initially having a geometry as indicated by a broken line before it is etched, has a surface layer removed, as indicated by arrows. Isolation oxide film 5a, 5b having been etched has a geometry as indicated by a solid line. Furthermore, silicon oxide film 10 overlying a main surface of silicon substrate 1 (see FIG. 11) is also etched away. Thus, a protrusion corresponding to an upper portion of isolation oxide film 5a, 5b is reduced to have a smaller width than trench 2a, 2b and a film formed of stacked layers serving as a mask layer (the film formed of stacked layers disposed on a main surface of semiconductor substrate 1 and including silicon oxide film 10) is also removed. As a result, the structure shown in FIG. 15 is obtained.

In doing so, at edge 17 of an upper portion of trench 2a, 2b, as has been shown in the FIG. 12 step, semiconductor substrate 1 has a curved surface attributed to a bird's beak. This reduces charge concentration in the semiconductor device at edge 17, as described later. Furthermore, isotropically etching the isolation oxide film, as shown in FIG. 15, can stabilize edge 17 in geometry. More specifically, if isolation oxide film 5a, 5b isotropically etched away as shown in FIG. 15 has a surface layer varying in thickness for different etching conditions, edge 17 having a curved surface can contribute to relatively reduced, positional variation of an end of isolation oxide film 5a, 5b in a direction across a depth of semiconductor substrate 1 (i.e., that of a portion at which a main surface of semiconductor substrate 1 at edge 17 and an upper surface of isolation oxide film 5a, 5b contact each other).

Figure 16:
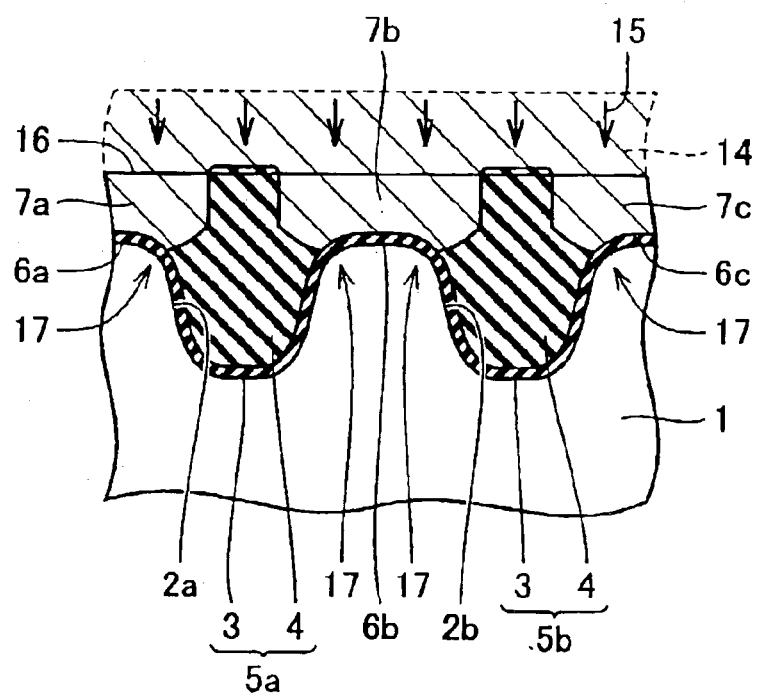

Then, similarly as shown in the FIG. 7 step, on a main surface of semiconductor substrate 1 in an active region a silicon oxide film is disposed to serve as tunnel insulation film 6a–6b (FIG. 16). Then on tunnel insulation film 6a–6c isolation oxide film 5a, 5b is buried under conductive polysilicon film 14 (FIG. 16). Polysilicon film 14 has an upper surface layer for example chemically, mechanically polished and thus removed away. As a result, as indicated in FIG. 16 by arrows, polysilicon film 14 has an upper surface 16 receding to a position indicated by a solid line.

Isolation oxide film 5a, 5b accordingly has an upper surface exposed. As such, polysilicon film 14 is separated by isolation oxide film 5a, 5b. As a result, polysilicon film 14 forms floating gate electrode 7a–7c. The configuration shown in FIG. 16 is thus obtained.

Figure 17:
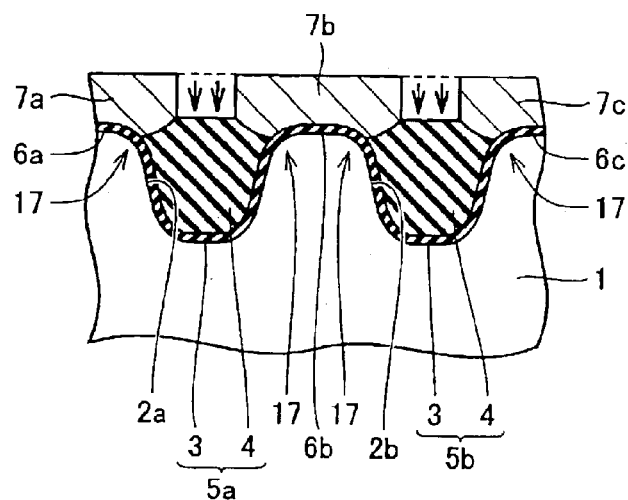

Then, similarly as has been described in the FIG. 8 step, isolation oxide film 5a, 5b is wet-etched or similarly, isotropically etched to have an upper portion removed. As a result, floating gate electrode 7a–7c has an exposed side surface. The structure as shown in FIG. 17 is thus obtained.

Thereafter, ONO film 8 (FIG. 9) and control gate electrode 9 (FIG. 9) are disposed to obtain the semiconductor device shown in FIGS. 9 and 10.

Third Embodiment

Figure 18:
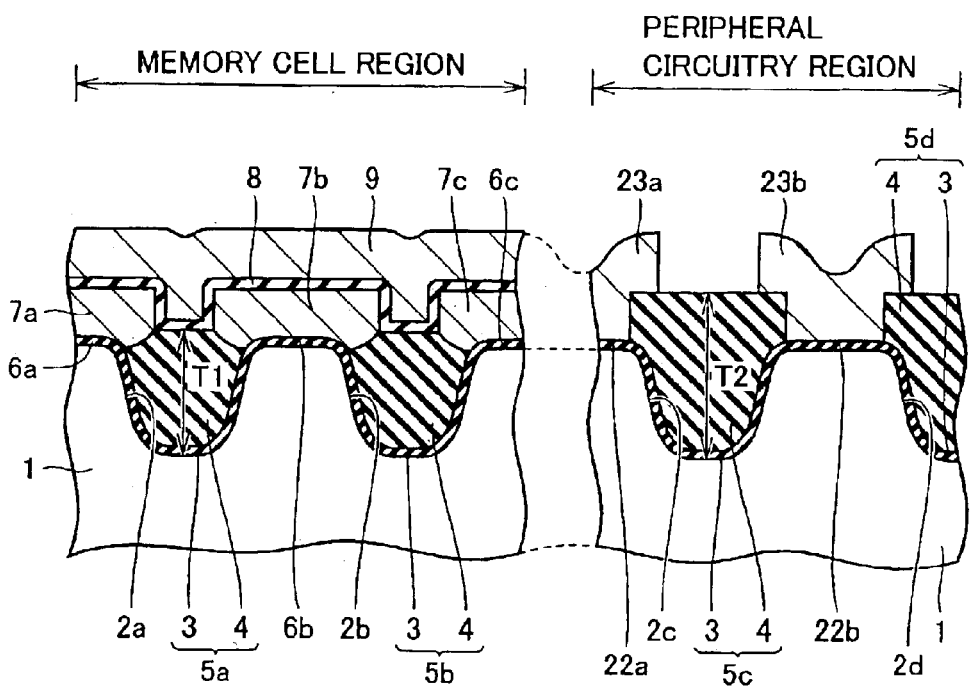
FIG. 18 is a schematic cross section of the present semiconductor device in a third embodiment.

With reference to FIG. 18, the present semiconductor device in a third embodiment will be described hereinafter.

As shown in FIG. 18, the semiconductor device is a non-volatile semiconductor memory device including a memory cell region provided with floating gate electrode 7a–7c, control gate electrode 9 and the like, and a peripheral circuitry region provided with field effect transistors configured of gate electrodes 23a, 23b, gate insulation film 22a, 22b, and source/drain regions (not shown). The memory cell region has a structure similar to that of the present semiconductor device in the first embodiment shown in FIG. 1.

In the peripheral circuitry region, semiconductor substrate 1 has a main surface provided with trench 2c, 2d. Trench 2c, 2d has an internal wall surface with oxide film 3 disposed thereon. On oxide film 3 HDP-CVD oxide film 4 is disposed to fill trench 2c, 2d and also extend to a main surface of semiconductor substrate 1. Oxide film 3 and HDP-CVD oxide film 4 form isolation oxide film 5c, 5d. Isolation oxide film 5c, 5d separates a device formation region, in which semiconductor substrate 1 has a main surface with gate insulation film 22a, 22b disposed thereon. Note that via a channel region underlying gate insulation film 22a, 22b, spaced source/drain regions (not shown) are provided opposite as seen in a direction perpendicular to the plane of FIG. 18. On gate insulation film 22a, 22b gate electrode 23a, 23b is provided.

As can be seen from FIG. 18, a thickness T2 of isolation oxide film 5c, 5d in the peripheral circuitry region is larger than a thickness T1 of isolation oxide film 5a, 5b in the memory cell region.

The FIG. 18 present semiconductor device in one example has a characteristic configuration summarized as follows: the semiconductor device is a non-volatile semiconductor memory device having the FIG. 1 semiconductor device's characteristic configuration, characterized in that semiconductor substrate 1 includes a memory cell region and a peripheral circuitry region. In the FIG. 18 semiconductor device, the memory cell region has formed therein a memory cell of flash memory including floating gate electrode 7a–7c, ONO film 8 serving as an insulation film and control gate electrode 9. The peripheral circuitry region is a region other than the memory cell region. The peripheral circuitry region has trench 2c, 2d provided in a main surface of semiconductor substrate 1 to serve as another trench. The semiconductor device further includes isolation oxide film 5c, 5d provided in trench 2c, 2d and serving another isolation insulator. As seen in a direction substantially perpendicular to the main surface of semiconductor substrate 1, thickness T2 of isolation oxide film 5c, 5d arranged in the peripheral circuitry region is larger than thickness T1 of isolation oxide film 5a, 5b arranged in the memory cell region and serving as isolation insulator.

The semiconductor device thus configured can be as effective as the FIG. 1 semiconductor device and also increase isolation breakdown voltage, junction breakdown voltage of isolation oxide film 5c, 5d in the peripheral circuitry region. This is because isolation oxide film 5c having large thickness T2 hardly allows an impurity introduced after the provision of gate electrode 23a, 23b to be introduced into semiconductor substrate 1 adjacent to isolation oxide film 5c. As a result, the semiconductor device can provide increased reliability.

With reference to FIGS. 19–28 the FIG. 18 semiconductor device is fabricated, as described hereinafter.

Initially in the semiconductor substrate 1 (see FIG. 19) at the memory cell and peripheral circuitry regions on a main surface of semiconductor substrate 1 a silicon oxide film (not shown) is disposed. On this silicon oxide film a silicon nitride film (not shown) is disposed. On the silicon nitride film a patterned resist (not shown) is disposed. This resist film is used as a mask in dry-etching or similarly, anisotropically etching the silicon nitride and oxide films to remove the films partially. The resist film is then removed.

Figure 19:
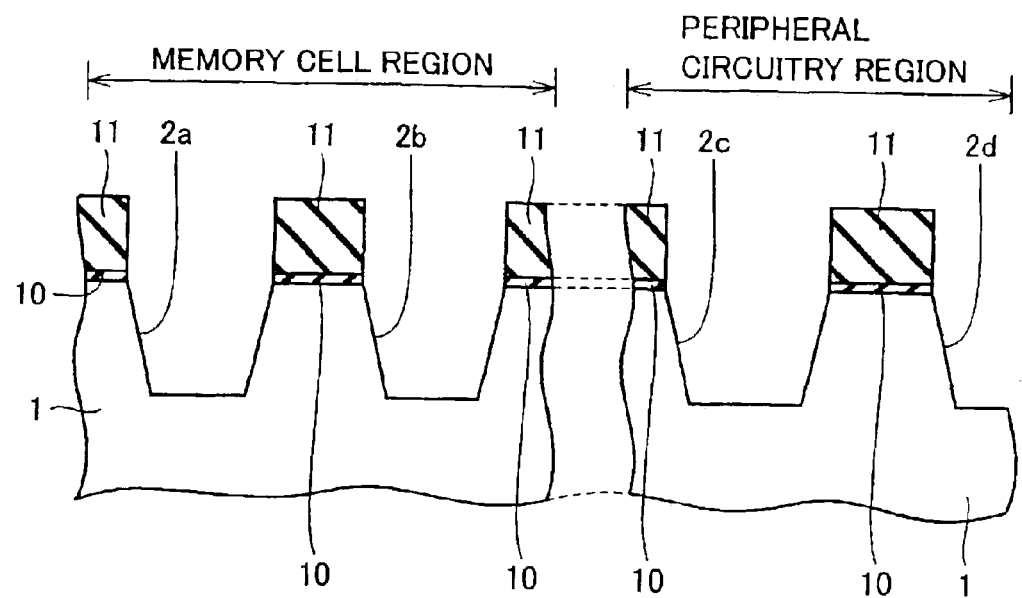
FIGS. 19–28 are schematic cross sections for illustrating first to tenth steps, respectively, of a method of fabricating the FIG. 18 semiconductor device.

As a result, semiconductor substrate 1 has a main surface underlying a silicon oxide film 10 (see FIG. 19) and a silicon nitride film 11 (see FIG. 19) having an open pattern. Silicon nitride and oxide films 11 and 10 are used as a mask in anisotropically etching a main surface of semiconductor substrate 1 to partially remove it. As a result, as shown in FIG. 19, semiconductor substrate 1 has a main surface provided with trench 2a–2d. Thus the step of providing semiconductor substrate 1 at a main surface thereof with two trenches 2a and 2b and the step of providing the peripheral circuitry region at a main surface of semiconductor substrate 1 with different trenches 2c, 2d are simultaneously performed.

Figure 20:
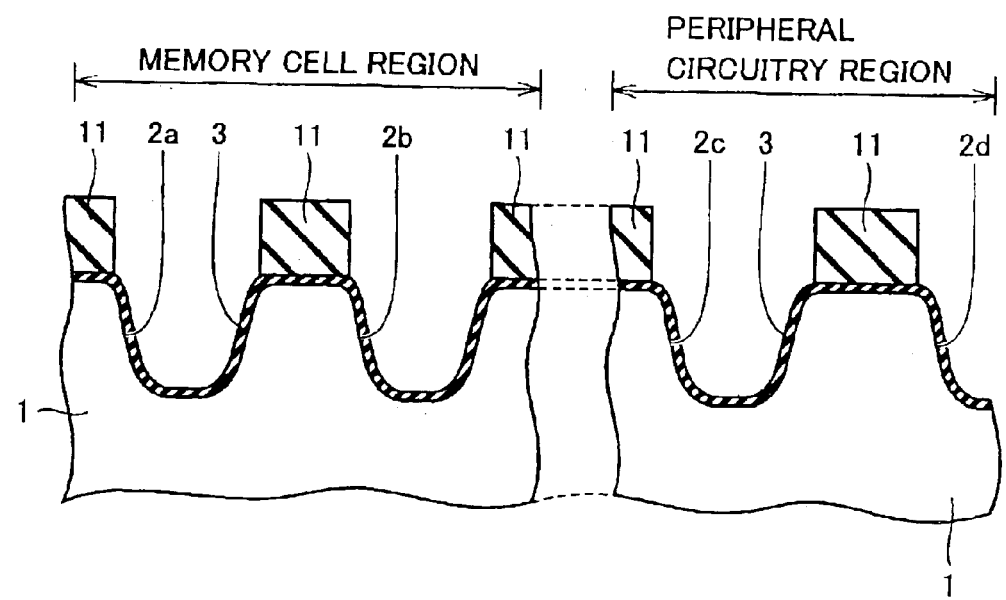

Then, similarly as has been shown in the FIG. 3 step, trench 2a–2d has an internal wall surface thermally oxidized to provide oxide film 3 (see FIG. 20) to provide such a structure as shown in FIG. 20.

Figure 21:
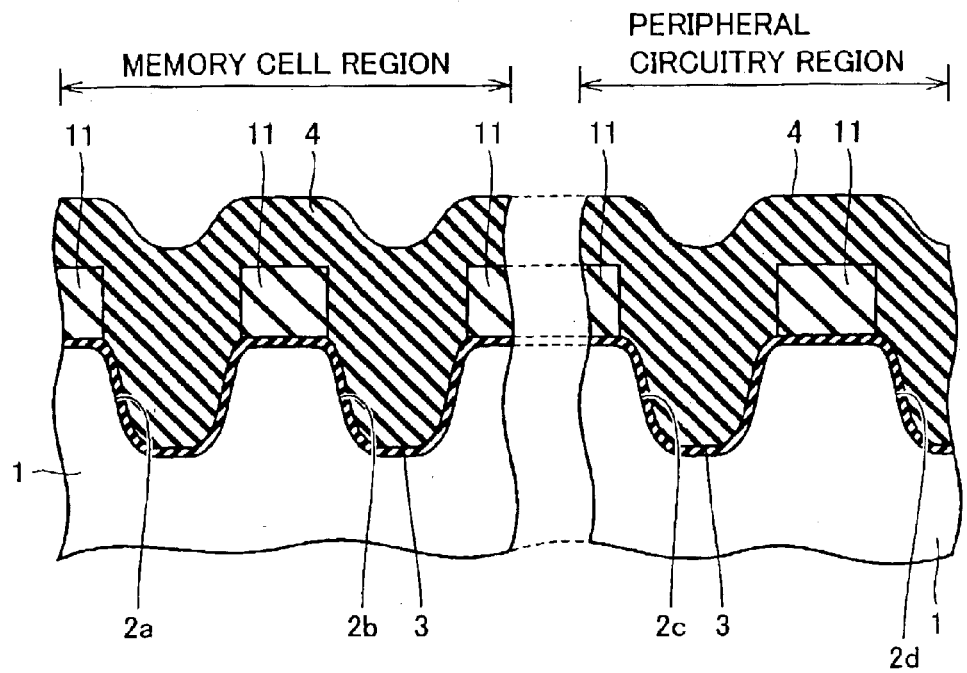

Then, as shown in FIG. 21, on oxide film 3 trench 2a–2d is filled with HDP-CVD oxide film 4. HDP-CVD oxide film 4 fills trench 2a–2d and also extends to reach an upper surface of silicon nitride film 11.

Figure 22:
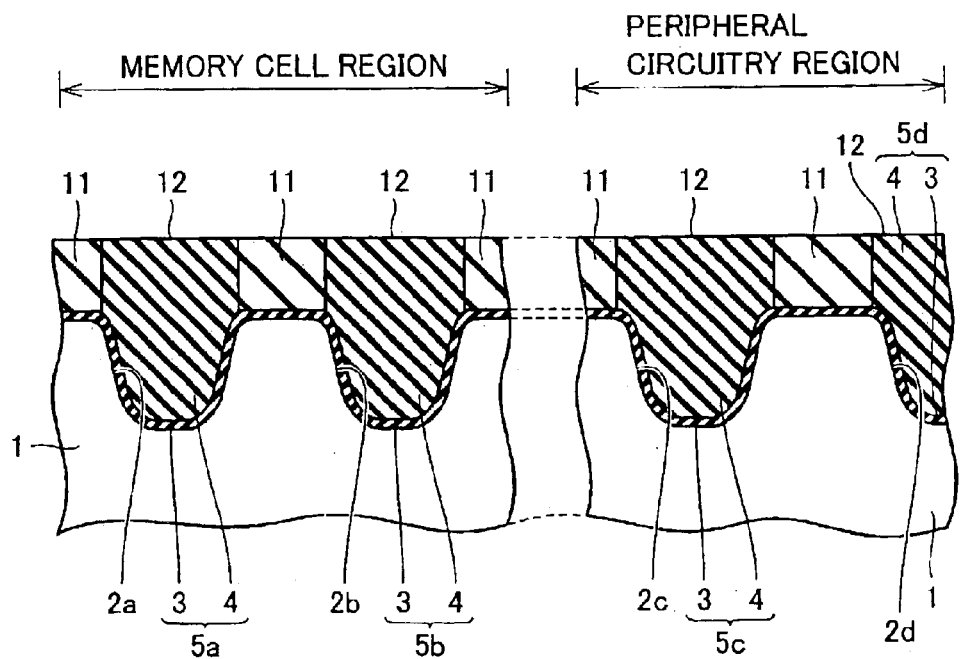

HDP-CVD oxide film 4 is then chemically mechanically polished to have an upper surface layer thereof removed. This allows silicon nitride film 11 to have an upper surface exposed and HDP-CVD oxide film 4 to have a flat upper surface 12, as shown in FIG. 22. As a result, trench 2a–2d is internally provided with isolation oxide film 5a–5d formed of oxide film 3 and HDP-CVD oxide film 4. Thus, the step of providing isolation oxide film 5a, 5b serving as an isolation insulator, and the step of providing in trench 2c, 2d isolation oxide film 5c, 5d serving as another isolation insulator having a portion protruding upper than a main surface of semiconductor substrate 1, are performed.

Silicon nitride film 11 (see FIG. 22) is then wet-etched away. Then in the peripheral circuitry region on silicon oxide film 10 and isolation oxide film 5c, 5d a resist film 24 (see FIG. 23) is disposed to serve as a protection film. Then, similarly as has been shown in the FIG. 6 step, in the memory cell region isolation oxide film 5a, 5b has an upper portion wet-etched or similarly, isotropically etched to have a portion removed.

Figure 23:
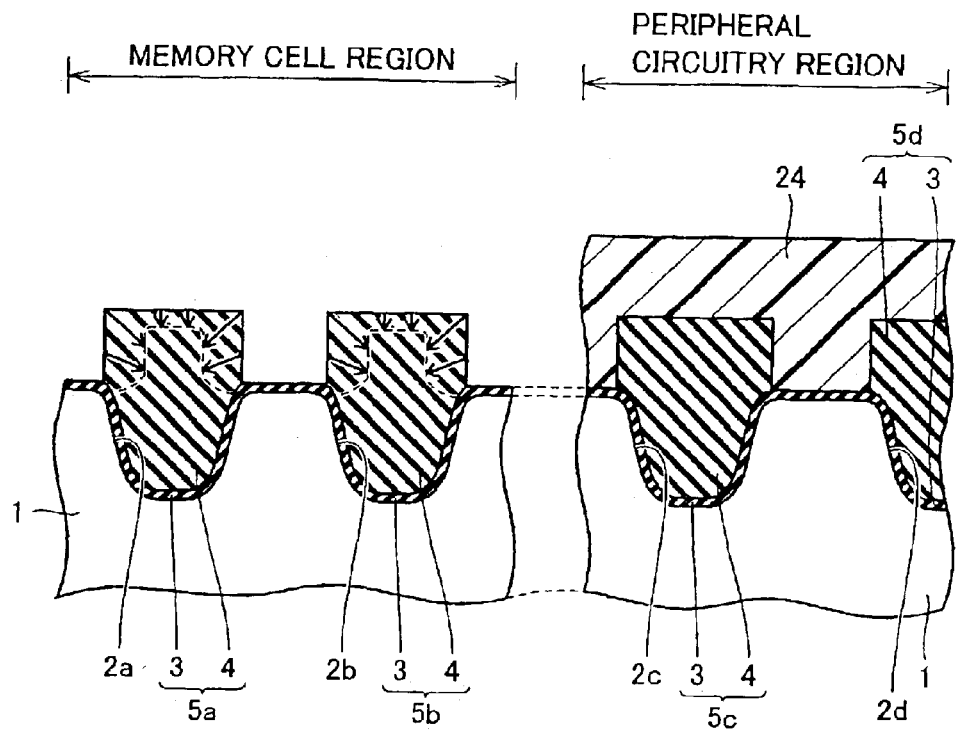

As a result, isolation oxide film 5a, 5b has an upper portion etched to have a geometry, as shown in FIG. 23 by a broken line. Furthermore, at that time, in the device formation region, silicon oxide film 10 overlying a main surface of semiconductor substrate 1 is removed.

Resist film 24 serving as a protection film can prevent the peripheral circuitry region from having isolation oxide film 5c, 5d etched away. Thus, as seen in a direction substantially perpendicular to a main surface of semiconductor substrate 1, thickness T2 of isolation oxide film 5c, 5d can be larger than thickness T1 of isolation oxide film 5a, 5b provided in the memory cell region (see FIG. 18).

Then in the peripheral circuitry region resist film 24 (see FIG. 23) and silicon oxide film 10 (see FIG. 23) overlying a main surface of semiconductor substrate 1 are removed. Then in the memory cell and peripheral circuitry regions on an exposed main surface of semiconductor substrate 1 tunnel insulation film 6a–6e (see FIG. 24) is disposed. On tunnel insulation film 6a–6e isolation oxide film 5a–5d is buried by polysilicon film 14 (see FIG. 24).

Figure 24:
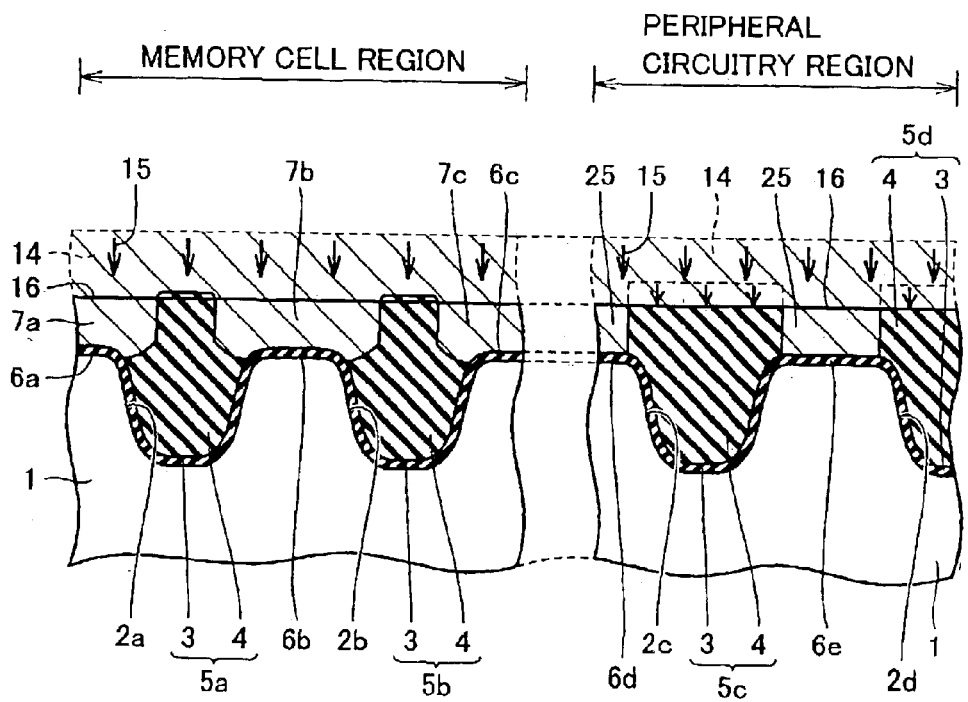

Polysilicon film 14 is them chemically mechanically polished to have an upper surface layer thereof removed. This allows isolation oxide film 5a–5d to have an upper surface exposed and also polysilicon film 14 to have an upper surface 16 receding to a position indicated in FIG. 24 by a solid line. As a result, floating gate electrode 7a–7c and a conductive layer 25 are provided divided by isolation oxide film 5a–5d. Floating gate electrode 7a–7c and conductor layer 25 have upper surface 16 planarized by the chemical mechanical polishing described above. The structure shown in FIG. 24 is thus obtained.

Figure 25:
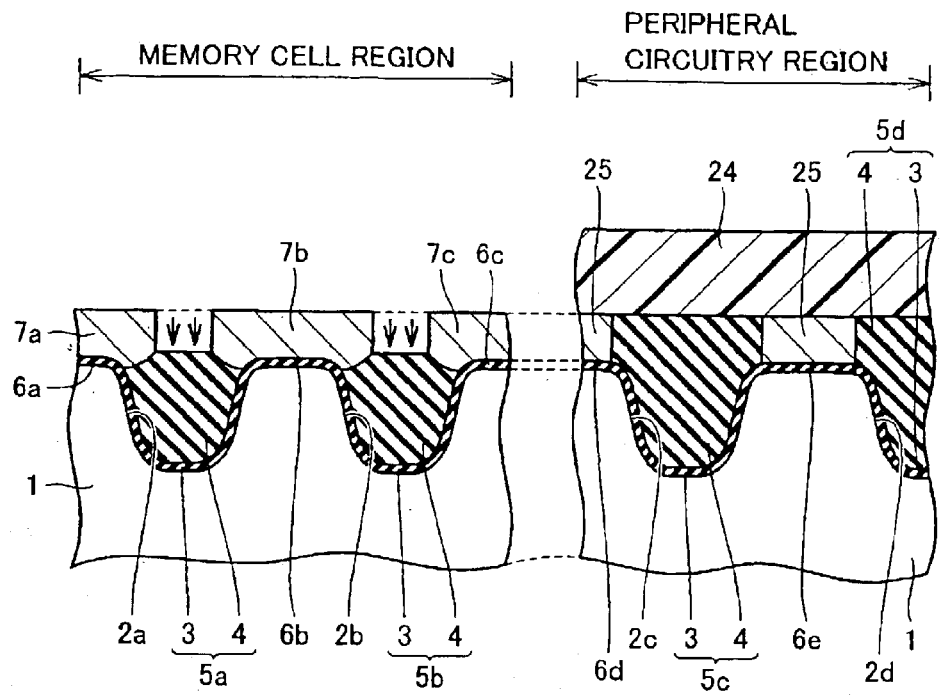

Then in the peripheral circuitry region on isolation oxide film 5c, 5d and conductor layer 25 resist film 24 (see FIG. 25) is disposed. The intermediate product is then wet etched to partially remove an upper portion of isolation oxide film 5a, 5b situated in the memory cell region. As a result, as shown in FIG. 25, in the memory cell region floating gate electrode 7a–7c has an exposed side surface.

Figure 26:
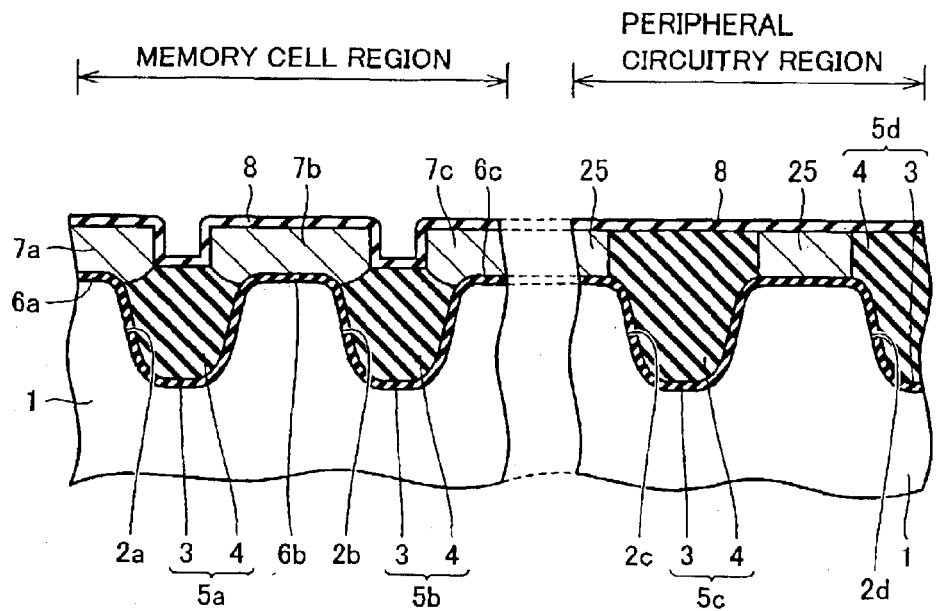

Then the peripheral circuitry region's resist film 24 (see FIG. 25) is removed. ONO film 8 is then disposed on upper and side surfaces of floating gate electrode 7a–7c, an upper surface of isolation oxide film 5a, 5b, and upper surfaces of the peripheral circuitry region's isolation oxide film 5c, 5d and conductor layer 25 (see FIG. 26). As a result, the structure shown in FIG. 26 is obtained.

Figure 27:
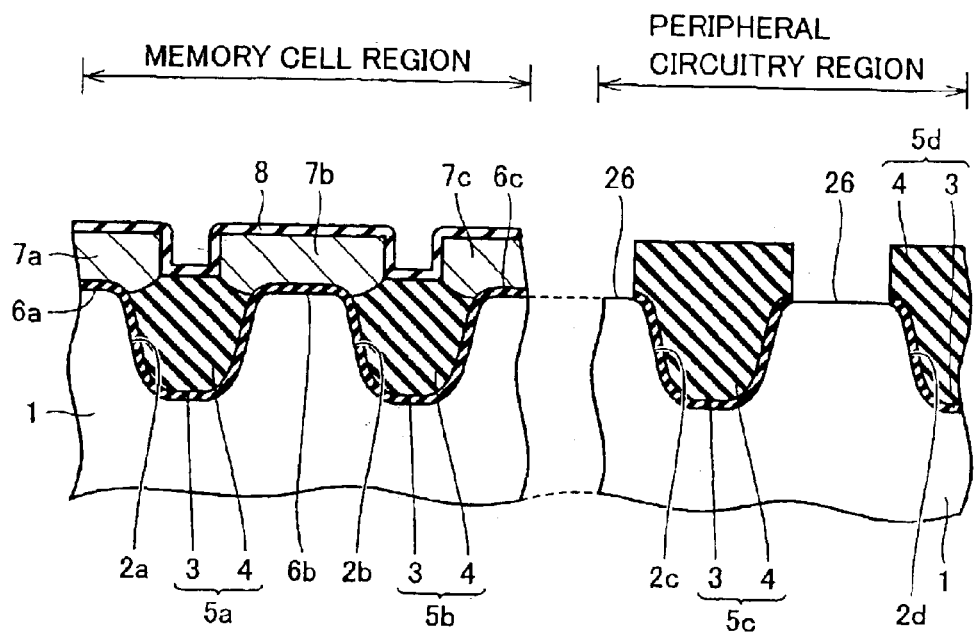
Figure 28:
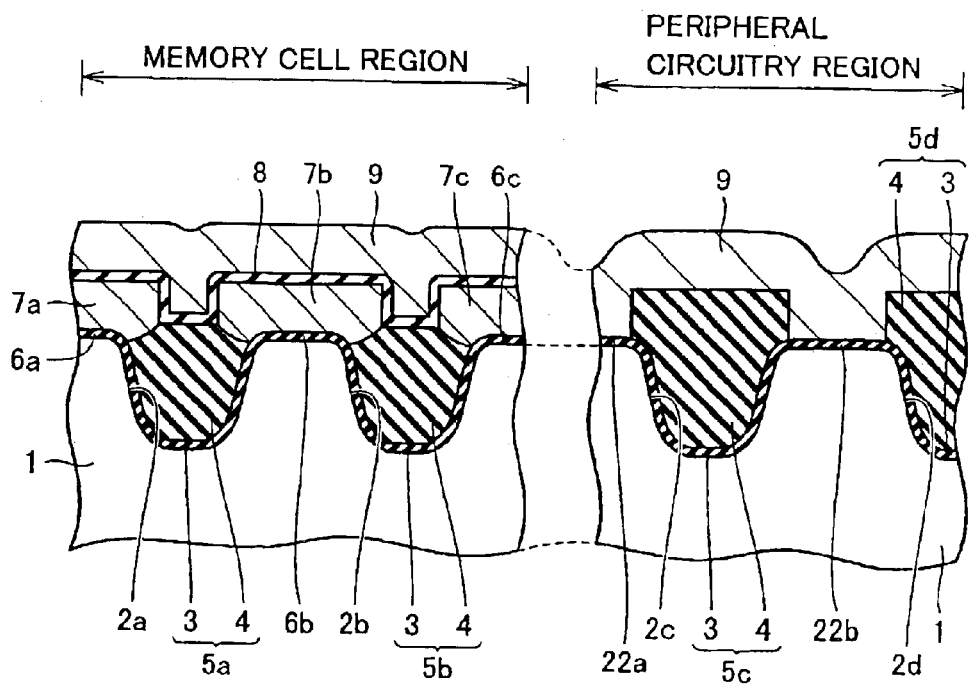

Then in the peripheral circuitry region ONO film 8 (see FIG. 26), conductor layer 25 (see FIG. 26) and tunnel insulation film 6d, 6e (see FIG. 26) are etched away. In doing so, the memory cell region is preferably protected for example by resist film. Thus, as shown in FIG. 27, in the peripheral circuitry region at the device formation region a substrate surface 26 is exposed.

Then in the peripheral circuitry region on substrate surface 26 (see FIG. 27) gate insulation film 22a, 22b (see FIG. 28) is disposed. Then across the memory cell and peripheral circuitry regions on ONO film 8 (see FIG. 28) and gate insulation film 22a, 22b and on isolation oxide film 5c, 5d control gate electrode 9 is disposed. Then in the peripheral circuitry region on control gate electrode 9 a resist pattern is disposed and used as a mask in partially removing control gate electrode 9 to form gate electrode 23a, 23b as shown in FIG. 18. The resist film is then removed.

Thus the FIG. 18 semiconductor device can be obtained.

Fourth Embodiment

Figure 29:
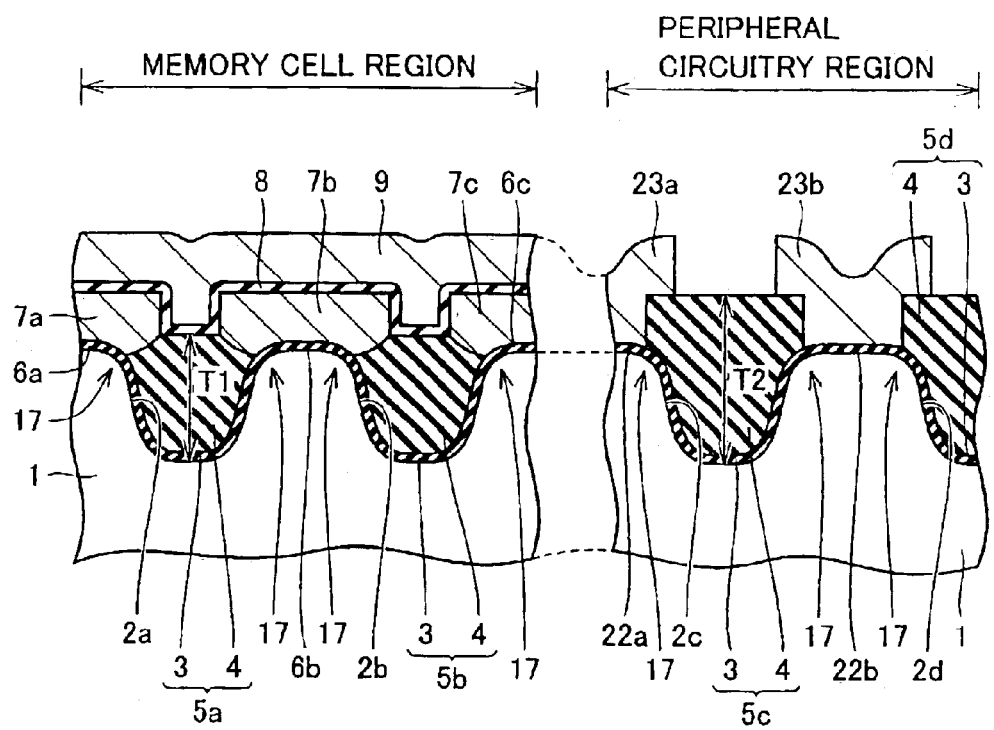
FIG. 29 is a schematic cross section of the present semiconductor device in a fourth embodiment.

With reference to FIG. 29 the present semiconductor device in a fourth embodiment will be described.

As shown in FIG. 29, the semiconductor device is basically similar in structure to the FIG. 18 semiconductor device, except that in the FIG. 29 semiconductor device, isolation oxide film 5a–5d has opposite edges 17 having a curvature similar to that of edge 17 of the FIGS. 9 and 10 semiconductor device.

The FIG. 29 present semiconductor device in one example has the FIGS. 9 and 10 semiconductor device's characteristic configuration and the FIG. 18 semiconductor device's characteristic configuration. As such, the FIG. 29 semiconductor device can provide an effect similar to that provided by the configuration characteristic to the FIGS. 9 and 10 semiconductor device and that characteristic to the FIG. 18 semiconductor device.

Figure 30:
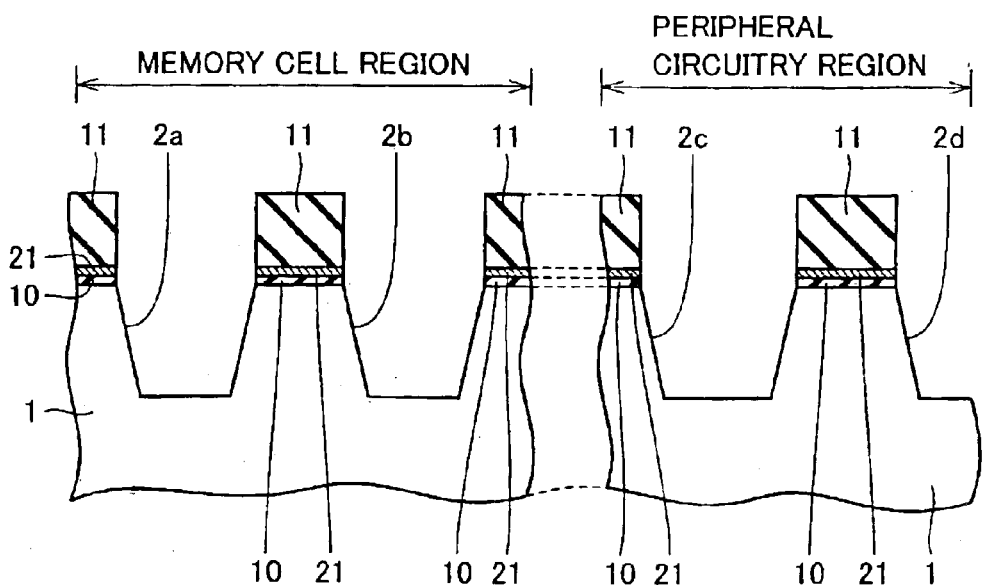
FIGS. 30 and 31 are schematic cross sections for illustrating first and second steps, respectively, of a method of fabricating the FIG. 29 semiconductor device.
Figure 31:
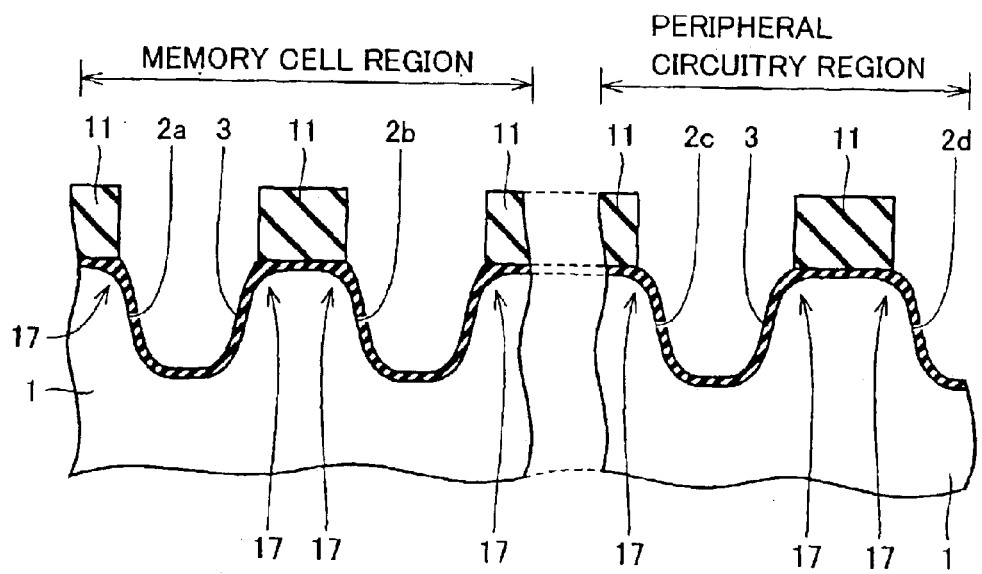

With reference to FIGS. 30 and 31 the FIG. 29 semiconductor device is fabricated, as described hereinafter.

Initially on a main surface of semiconductor substrate 1 (see FIG. 30) a silicon oxide film (not shown) is disposed. On this silicon oxide film a polysilicon film (not shown) is disposed. On this polysilicon film a silicon nitride film (not shown) is disposed. On the silicon nitride film a patterned resist film is disposed. This resist film is used as a mask in anisotropically etching the stack of the silicon nitride film, the polysilicon film and the silicon oxide film to partially remove it. The resist film is then removed. As a result, semiconductor substrate 1 has a main surface underlying a stack of silicon nitride film 11 (FIG. 30), polysilicon film 21 (FIG. 30) and silicon oxide film 10 (FIG. 30) having an open pattern. The stack of the layers is used as a mask in anisotropically etching a main surface of semiconductor substrate 1 to partially remove it. As a result, as shown in FIG. 30, semiconductor substrate 1 can have a main surface provided with trench 2a–2d. The structure shown in FIG. 30 is thus obtained.

Then in order to alleviate etching-stress in semiconductor substrate 1 trench 2a–2d has an internal wall surface thermally oxidized to provide oxide film 3 (see FIG. 31). In doing so, with the existence of polysilicon film 21, at edge 17 located at an upper end of trench 2a–2d, similarly as has been shown in the FIG. 12 step, a bird's beak extends and consequently semiconductor substrate 1 has a surface curved. The structure shown in FIG. 31 is thus obtained.

Thereafter the FIGS. 21–28 steps of the present semiconductor fabrication method in the third embodiment are performed to obtain the FIG. 29 semiconductor device.

Fifth Embodiment

Figure 32:
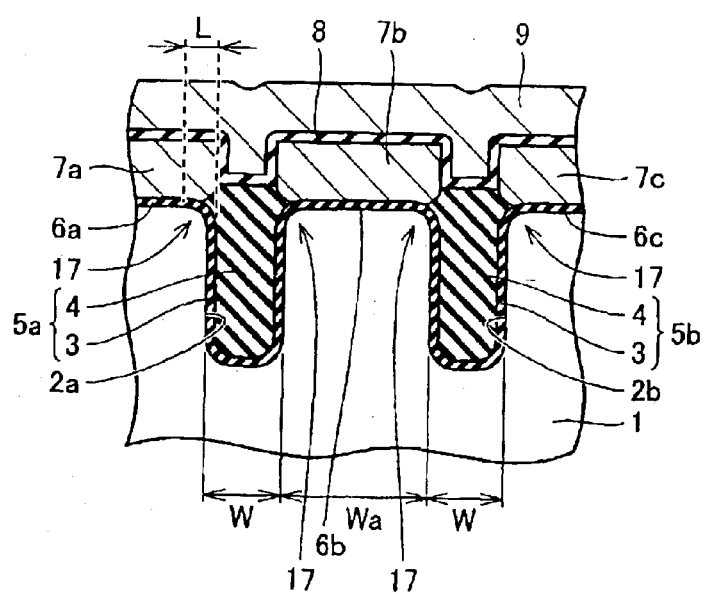
FIG. 32 is a schematic cross section of the present semiconductor device in a fifth embodiment.

With reference to FIG. 32, the present semiconductor device in a fifth embodiment will be described.

As shown in FIG. 32, the semiconductor device is basically similar in structure to the FIGS. 9 and 10 semiconductor device, except that isolation oxide film 5a, 5b provided in trench 2a, 2d having a width W smaller than that of trench 2a, 2d (FIG. 9) of the FIGS. 9 and 10 semiconductor device. The FIG. 32 semiconductor device has trench 2a, 2d having width W smaller than a minimum processing dimension in a photolithography process employed in fabricating the FIG. 32 semiconductor device. Furthermore, from a different point of view, in the FIG. 32 semiconductor device, as compared to an active region's width Wa (a distance between trenches 2a and 2b), an isolation width, or the trench 2a, 2b width W, is smaller. As such in a memory cell region an active region can effectively be used.

Furthermore in the FIG. 32 semiconductor device edge 17 preferably has a curved portion with width L of 10 to 100 nm, more preferably 50 to 60 nm.

The FIG. 32 present semiconductor device has a configuration similar to that characteristic to the FIGS. 9 and 10 semiconductor device and also has a characteristic configuration as described below: in the FIG. 32 semiconductor device, as seen in a direction of a length of floating gate electrode 7a–7c, trench 2a, 2b has width W smaller than a minimum processing dimension in a photolithography process employed in forming trench 2a, 2b. In other words, as seen in the direction of the length of floating gate electrode 7a–7c, trench 2a, 2b has width W smaller than width Wa of an active region corresponding to a distance between trenches 2a and 2b. Furthermore in the above semiconductor device a sidewall surface of trench 2a, 2b and a main surface of semiconductor substrate 1 underlying floating gate electrode 7a–7c are connected by edge 17 allowing semiconductor substrate 1 to have a curved surface having width L of 10 to 100 nm as seen in a direction extending along a direction in which the semiconductor substrate 1 main surface extends.

The semiconductor device thus configured can be as effective as the FIGS. 9 and 10 semiconductor device and also allows semiconductor substrate 1 to have a main surface occupied by trench 2a, 2b having a reduced area. This can provide an increased number of memory cells including floating gate electrode 7a–7c, ONO film 8 and control gate 9 that are provided on a main surface of semiconductor substrate 1 per unit area. The semiconductor device thus allows increased degrees of integration.

Furthermore, in addition to trench 2a, 2b having width W reduced as described above, the connection located at an upper portion of trench 2a, 2b has a width (width L of a curved portion corresponding to a portion of a surface of the semiconductor substrate that is rounded) limited to the numerical range as described above. As such in a portion adjacent to trench 2a, 2b semiconductor substrate 1 can have a flat main surface and the trench 2a, 2b sidewall surface and the semiconductor substrate 1 main surface can be connected together by a portion having a sufficiently smoothly curved surface.

With reference to FIGS. 33–42 the FIG. 32 semiconductor device is fabricated, as described hereinafter.

Figure 33:
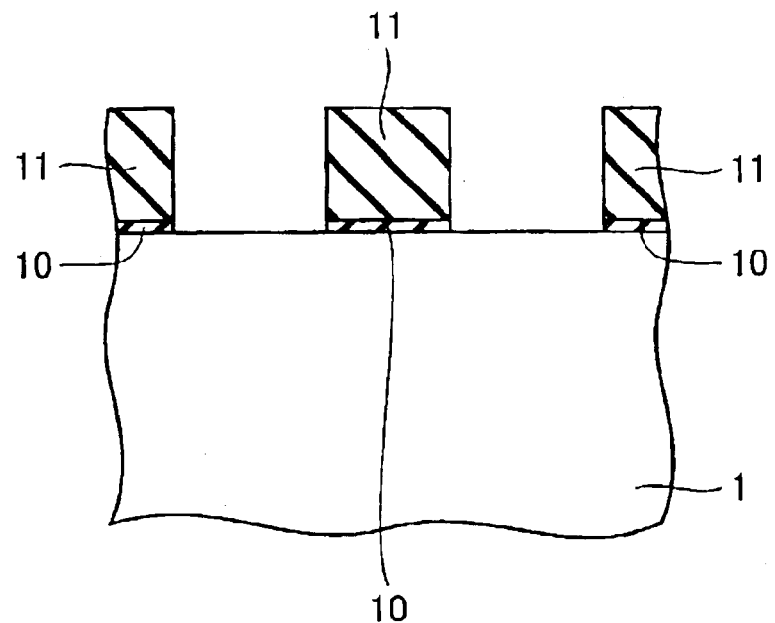
FIGS. 33–42 are schematic cross sections for illustrating first to tenth steps, respectively, of a method of fabricating the FIG. 32 semiconductor device.
Figure 34:
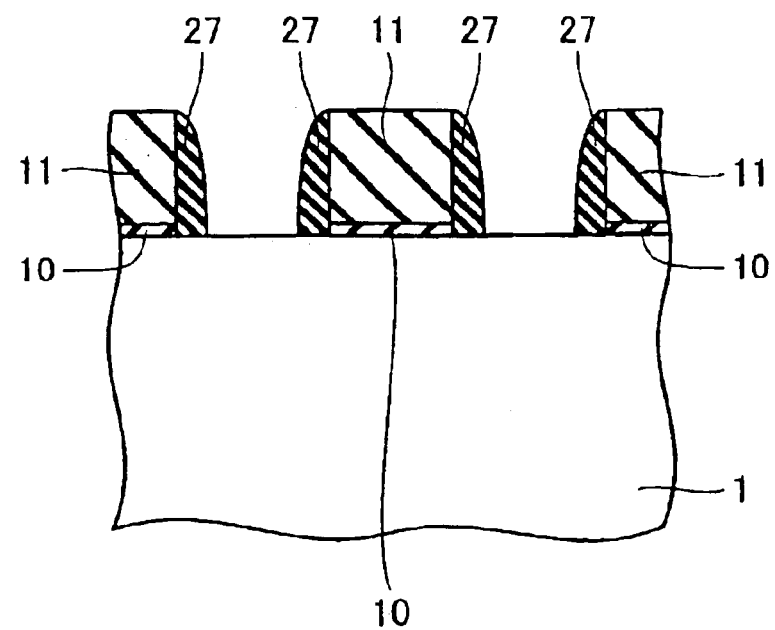

On a main surface of semiconductor substrate 1 (see FIG. 33) a silicon oxide film (not shown) is disposed. On this silicon substrate film, a silicon nitride film (not shown) is disposed. On the silicon nitride film, photolithography is employed to provide a patterned resist film (not shown). This resist film is used as a mask in anisotropically etching the silicon nitride and oxide films to partially remove the films. Note that in anisotropically etching the films, semiconductor substrate 1 also has a main surface removed to some extent, overetched. The resist pattern is then removed. A stack of silicon nitride and oxide films 11 and 10 having an open pattern and serving as a mask layer is thus provided. As a result, the structure as shown in FIG. 33 is obtained.

Then, a TEOS oxide film or other similar oxide film (not shown) is disposed to extend from an upper surface of silicon nitride film 11 to an exposed main surface of semiconductor conductor substrate 1. The oxide film is then anisotropically etched to be etched back to provide a sidewall oxide film 27 on a sidewall surface defining (or facing) an open pattern of silicon nitride and oxide films 11 and 10.

Figure 35:
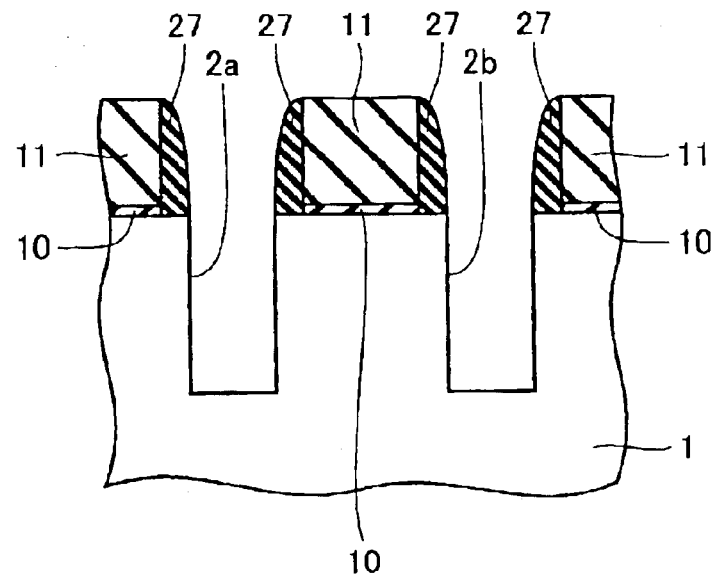

Silicon nitride and oxide films 11 and 10 stacked in layers and sidewall oxide film 27 are then used as a mask in anisotropically etching away a main surface of semiconductor substrate 1 partially. As a result, as shown in FIG. 35, semiconductor substrate 1 has a main surface provided with trench 2a, 2b, Trench 2a, 2b has a width smaller by that of sidewall oxide film 27 than that of the open pattern of silicon nitride and oxide films 11 and 10 (i.e., a distance defining the open pattern and extending between opposite sidewalls of silicon nitride and oxide films 11 and 10). As such, if the resist film used as an anisotropic etching mask to obtain the FIG. 35 structure has a pattern with a dimension corresponding approximately to a minimum processing dimension adopted in photolithography, sidewall oxide film 27 allows trench 2a, 2b to have a width smaller than the minimum processing dimension adopted in photolithography.

In other words, using as a mask the sidewall oxide film 27 provided on a sidewall facing an open pattern of a film formed of stacked layers as a mask layer, allows width W of trench 2a, 2b to be determined without any limitation imposed by the minimum processing dimension adopted in the photolithography employed to form the open pattern. As such, by adjusting sidewall oxide film 27 in width, a portion corresponding to a surface of semiconductor substrate 1 that is not covered with the film formed of stacked layers or sidewall oxide film 27 (i.e., a portion corresponding to a surface of semiconductor substrate 1 that is anisotropically etched) can be provided with a width smaller than the minimum processing dimension as described above. As a result, trench 2a, 2b (see FIG. 35) can have a width smaller than the minimum processing dimension to allow the semiconductor device to be highly integrated.

Figure 36:
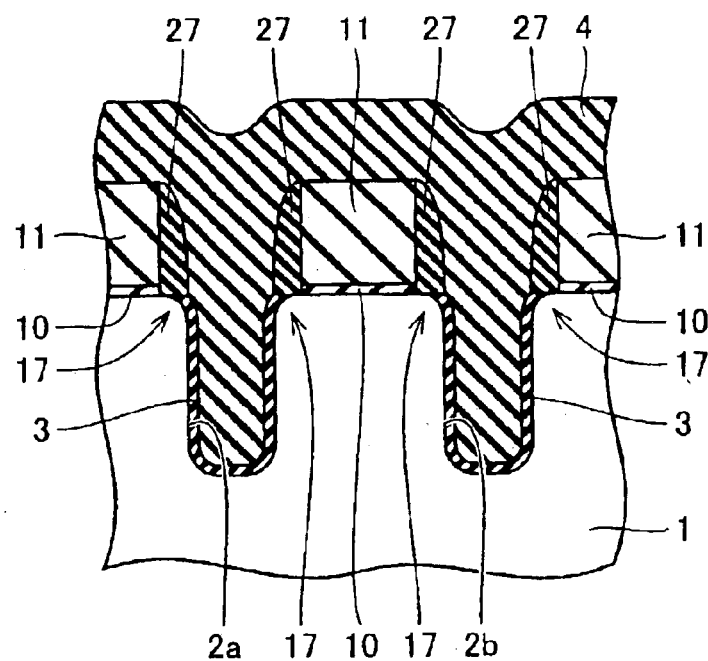

Then, similarly as has been shown in the FIG. 3 step, in order for example to alleviate etching-stress in semiconductor substrate 1, trench 2a has an internal wall surface thermally oxidized to provide oxide film 3 (see FIG. 36). In doing so, an oxidation species disperses in sidewall oxide film 27. This facilitates oxidation of semiconductor substrate 1 more at edge 17 than at a portion in a vicinity of a bottom wall of trench 2a, 2b. Thus at edge 17 semiconductor substrate 1 has a surface (an interface between semiconductor substrate 1 and oxide film 3) having a curvature.

Then oxide film 3 (see FIG. 36) is disposed and then on oxide film 3 trench 2a, 2b is filled with HDP-CVD oxide film 4 (see FIG. 36). HDP-CVD oxide film 4 filling trench 2a, 2b further extends to reach an upper surface of silicon nitride film 11. The structure as shown in FIG. 36 is thus obtained.

Figure 37:
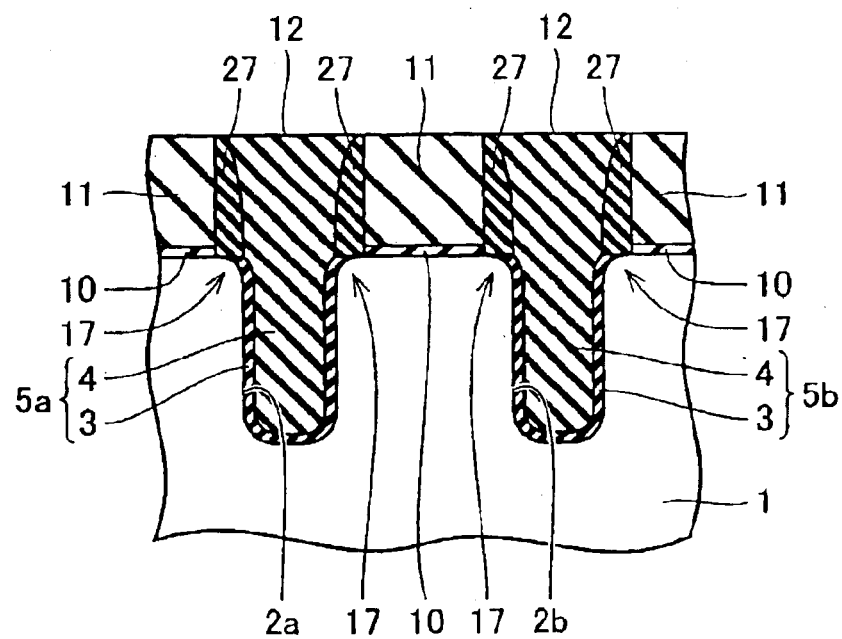

HDP-CVD oxide film 4 (see FIG. 36) is chemically mechanically polished to planarize and thus remove a surface layer thereof. As a result, as shown in FIG. 37, silicon nitride film 11 has an upper surface exposed and isolation oxide film 5a, 5b has a flat upper surface 12.

Figure 38:
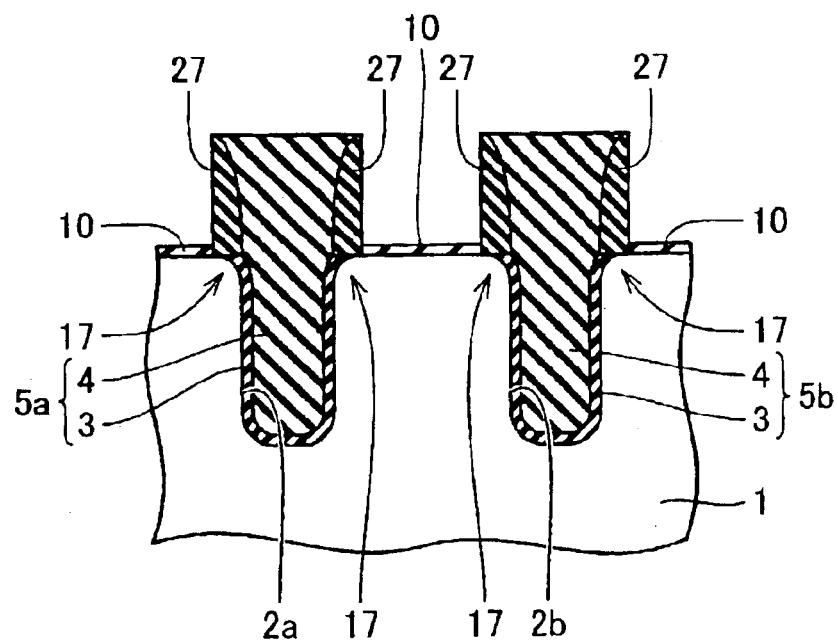

Then, thermal phosphoric acid or a similar etchant is used to wet-etch silicon nitride film 11 (see FIG. 37) away. As a result, the structure as shown in FIG. 38 is obtained.

Figure 39:
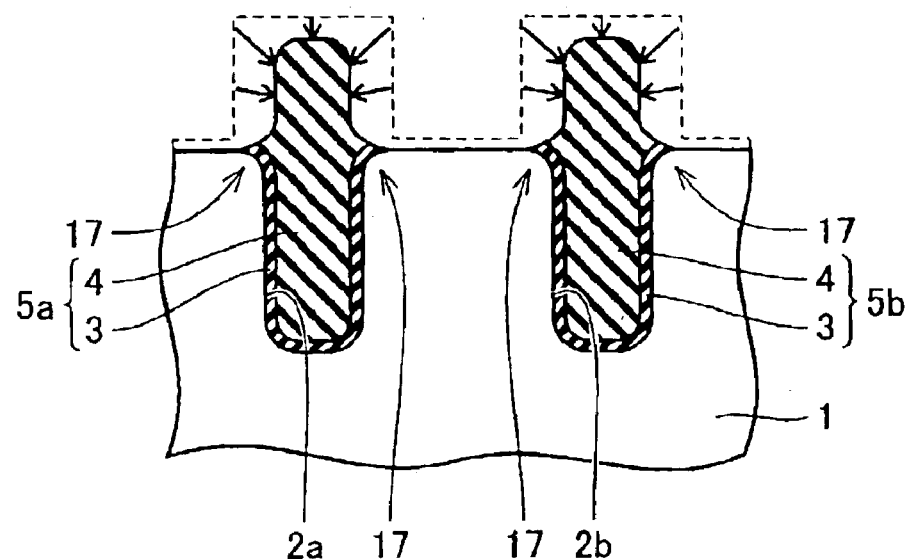

Then, fluoric acid or a similar etchant is employed to isotropically etch away sidewall oxide film 27 and isolation oxide film 5a, 5b at an upper portion partially. Simultaneously, silicon oxide film 10 on a main surface of semiconductor substrate 1 is also removed. As a result, the structure as shown in FIG. 39 is obtained.

Figure 40:
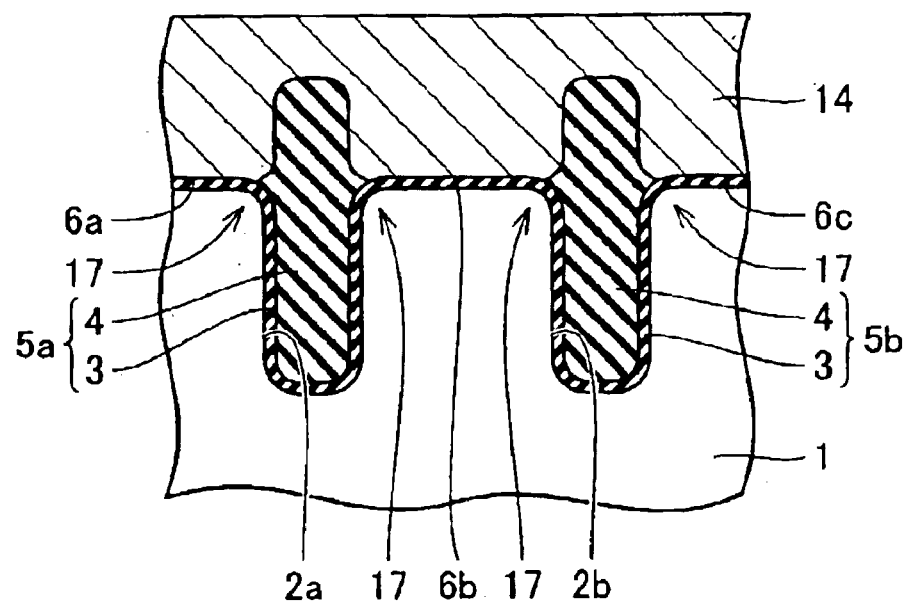

Then in a device formation region isolated by isolation oxide film 5a, 5b on a main surface of semiconductor substrate 1 tunnel insulation film 6a–6c (see FIG. 40) is disposed. Polysilicon film 14 (see FIG. 40) is disposed on tunnel insulation film 6a–6c, covering isolation oxide film 5a, 5b. As a result, the structure as shown in FIG. 40 is obtained.

Figure 41:
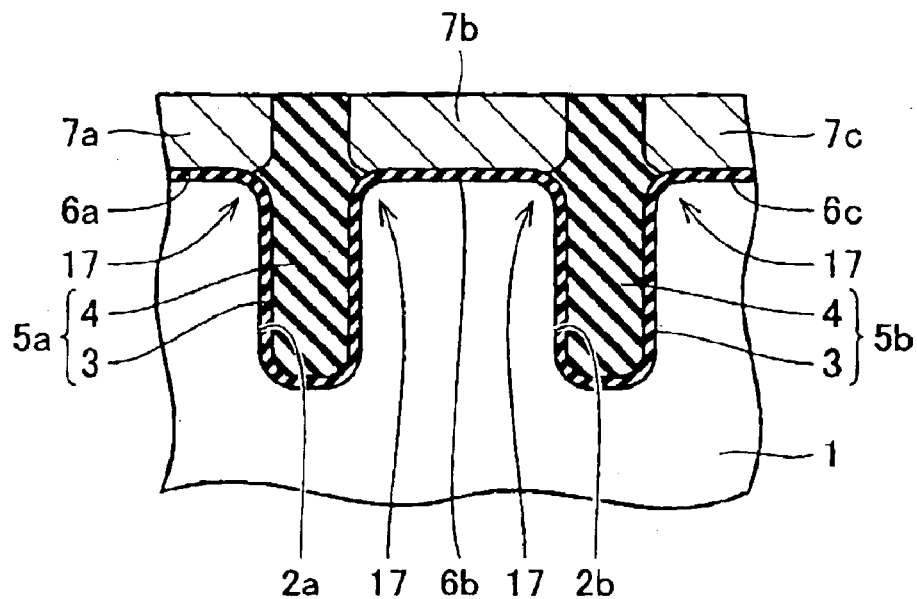

Polysilicon film 14 (FIG. 40) is chemically mechanically polished to have a surface layer thereof partially removed. As a result, as shown in FIG. 41, isolation oxide film 5a, 5b can have an exposed upper surface and floating gate electrode 7a–7c (see FIG. 41) having a flat upper surface can also be formed. Floating gate electrode 7a–7c are isolated by isolation oxide film 5a, 5b. As a result, the structure as shown in FIG. 41 is obtained.

Figure 42:
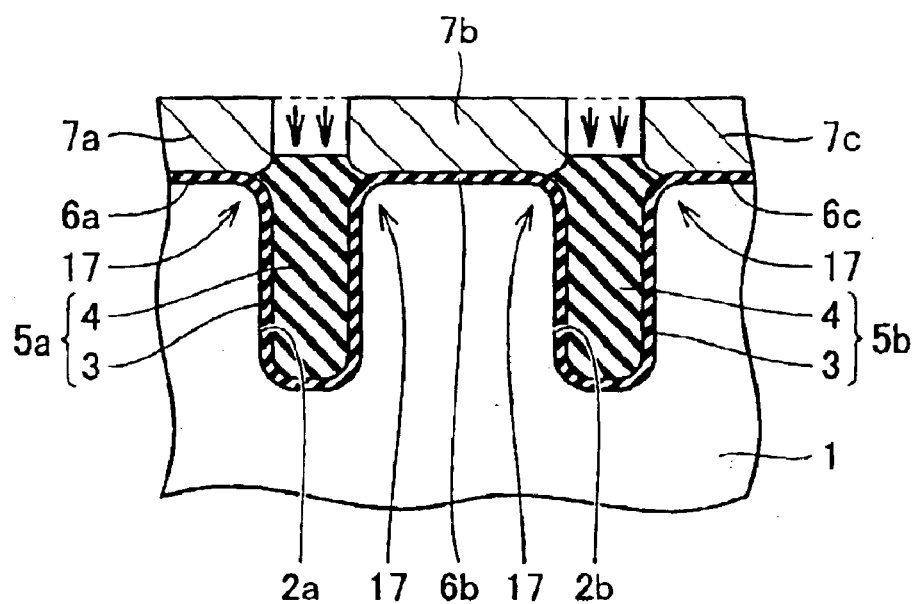

Then, similarly as has been shown in the FIG. 8 step, isolation oxide film 5a, 5b is wet-etched to have an upper portion thereof partially removed. As a result, as shown in FIG. 42, floating gate electrode 7a–7c has an exposed side surface.

ONO film 8 (see FIG. 32) and control gate electrode 9 (see FIG. 32) are then provided to obtain such a semiconductor device as shown in FIG. 32.

Sixth Embodiment

The FIGS. 43–46 semiconductor device fabrication method can provide a semiconductor device similar in structure to the FIG. 32 semiconductor device. Hereinafter with reference to FIGS. 43–46 the semiconductor device fabrication method will be described.

Figure 43:
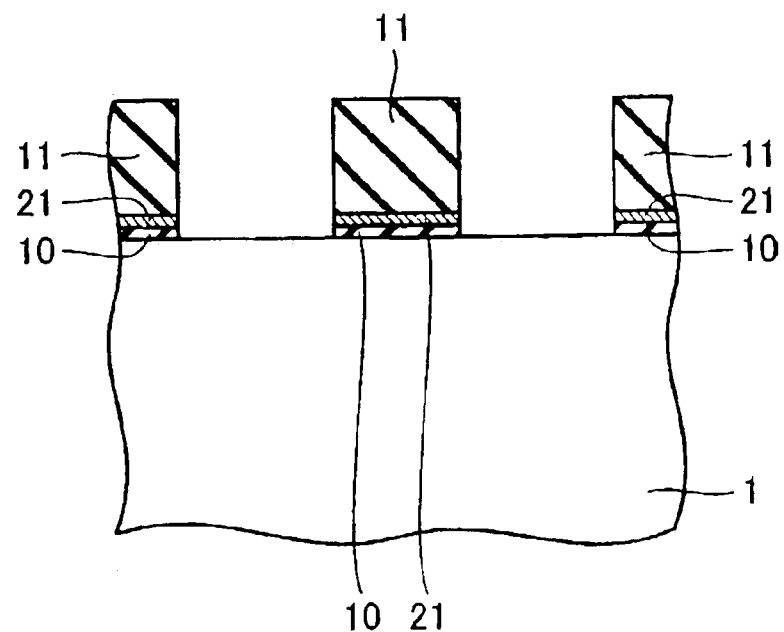
FIGS. 43–46 are schematic cross sections for illustrating first to fourth steps, respectively, of the present semiconductor device fabrication method in a sixth embodiment.

Initially on a main surface of semiconductor substrate 1 (see FIG. 43) a silicon oxide film (not shown) is disposed. On this silicon oxide film a polysilicon film (not shown) is disposed. On the polysilicon film a silicon nitride film (not shown) is disposed. On the silicon nitride film a patterned resist film (not shown) is disposed. This resist film is used as a mask in etching away the stack of the silicon nitride, polysilicon and silicon oxide films partially. The resist film is then removed. As a result, as shown in FIG. 43, there can be provided a film formed of a stack of silicon oxide film 10, polysilicon film 21 and silicon nitride film 11 and having a pattern on a main surface of semiconductor substrate 1.

Figure 44:
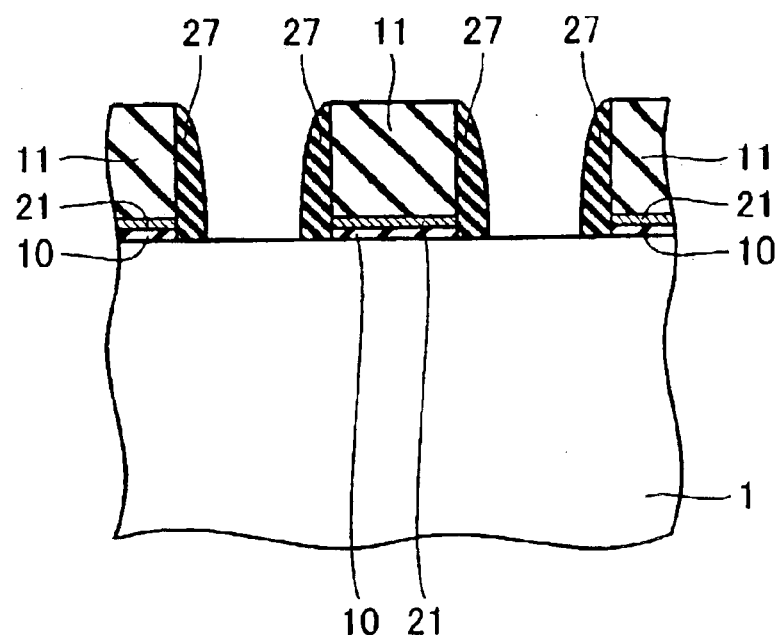

TEOS oxide film or any other similar oxide film (not shown) is then disposed to extend from an upper surface of silicon nitride film 11 to a main surface of silicon substrate 1. The oxide film is anisotropically etched to have a portion removed. As a result, as shown in FIG. 44, sidewall oxide film 27 is provided on a sidewall surface of silicon nitride film 11, polysilicon film 21 and silicon oxide film 10.

Figure 45:
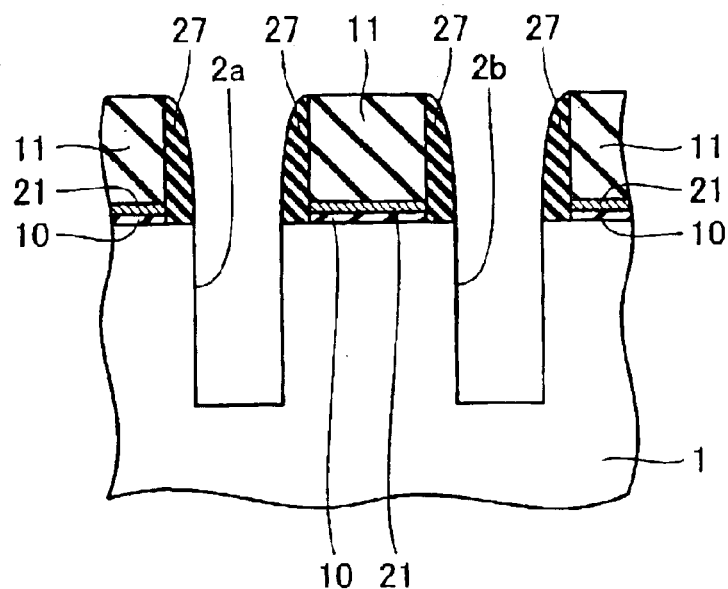

Silicon nitride film 11 and sidewall oxide film 27 are then used as a mask in anisotropically etching a main surface of semiconductor substrate 1 to partially remove it, similarly as has been shown in the FIG. 35 step. As a result, as shown in FIG. 45, semiconductor substrate 1 has a main surface provided with trench 2a, 2b. Trench 2a, 2b can have a width changed, as desired, by adjusting that of sidewall oxide film 27, and, similarly as in the semiconductor fabrication method described in the fifth embodiment, when silicon nitride film 11, polysilicon film 21 and silicon oxide film 10 stacked in a film provide opposite sidewall surfaces spaced by a distance approximately the same as a minimum processing dimension adopted in photolithography, sufficiently increasing sidewall oxide film 27 in width allows a width of trench 2a, 2b sufficiently smaller than the minimum processing dimension adopted in photolithography.

Figure 46:
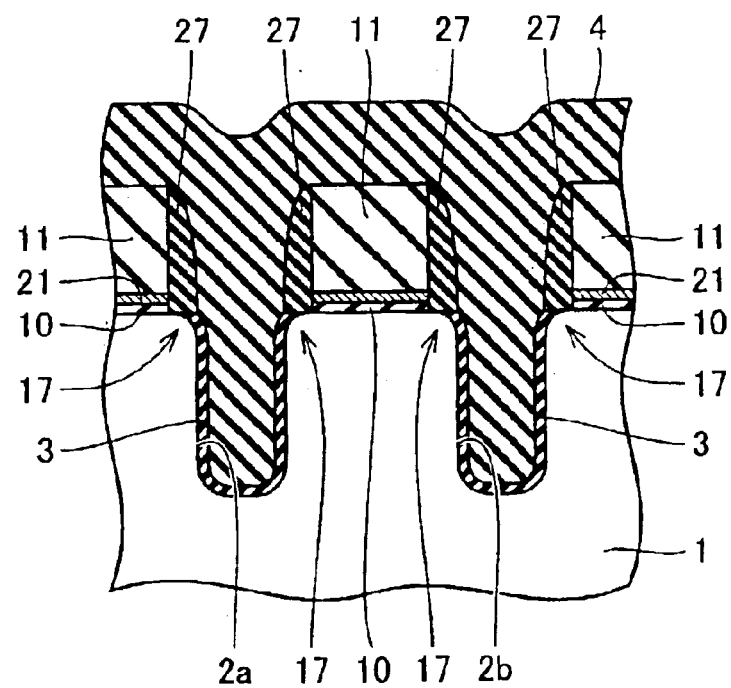

Then in order to alleviate etching-stress of semiconductor substrate 1 trench 2a, 2b has an internal wall surface thermally oxidized to provide oxide film 3 (see FIG. 46). In doing so, at edge 17, as an oxidation species disperses throughout sidewall oxide film 27, semiconductor substrate 1 is oxidized further than at the other portions. As a result, at edge 17 oxide film 3 is relatively increased in thickness and semiconductor substrate 1 has a smoothly curved surface. Then on oxide film 3 HDP-CVD oxide film 4 is disposed to fill trench 2a, 2b and also extend to an upper surface of silicon nitride film 11. As a result, the structure as shown in FIG. 46 is obtained.

Then steps similar to the FIGS. 37–42 steps are performed to obtain a semiconductor device similar in structure to the FIG. 32 semiconductor device.

Thus the FIGS. 43–46 semiconductor device fabrication method has the configurations characteristic to the semiconductor fabrication methods described in the second and fifth embodiments of the present invention. Thus it can be as effective as those described in the second and fifth embodiments.

Although the present invention has been described and illustrate in detail, it is already understood that the same is by way of illustration and example only and is not to be taken by way of limitation, the spirit and scope of the present invention being limited only by the terms of the appended claims.

What is claimed is:

1. A non-volatile semiconductor memory device comprising:
   a semiconductor substrate having a main surface provided with two spaced trenches;
   an isolation insulator filling said trench, said isolation insulator comprising a first oxide film and a second HDP-CVD oxide film, said second HDP-CVD oxide film having an upper surface extending downwardly toward said semiconductor substrate;
   a floating electrode having a flat surface and extending from the main surface of said semiconductor substrate between said two trenches to said two isolation insulators, wherein said upper surface of said second HDP-CVD oxide film is in contact with a portion of said floating electrode, and wherein said portion of said floating electrode, which is in contact with said upper surface of said second HDP-CVD oxide film, extends below said main surface of said semiconductor substrate;

an insulation film extending from the upper surface of said floating electrode to a side surface of said floating electrode overlying said isolation insulator; and a control gate disposed on said insulation film to extend from the upper surface of said floating electrode to the side surface of said floating electrode.

2. The non-volatile semiconductor memory device according to claim 1, wherein a sidewall surface of said trench and the main surface of said semiconductor substrate underlying said floating electrode are connected together by a portion providing said semiconductor substrate with a curved surface.

3. The non-volatile semiconductor memory device according to claim 1, wherein as seen in a direction of a length of said floating electrode, said trench has a width smaller than a distance between said two trenches.

4. The non-volatile semiconductor memory device according to claim 1, said semiconductor substrate including a memory cell region having formed therein a memory cell including said floating electrode, said insulation film and said control electrode, and a peripheral circuitry region corresponding to a region other than said memory cell region, in said peripheral circuitry region said semiconductor substrate having the main surface provided with another trench, the non-volatile semiconductor memory device further comprising another isolation insulator disposed in said another trench, wherein as seen in a direction substantially perpendicular to the main surface of said semiconductor substrate, said another isolation insulator arranged in said peripheral circuitry region is larger in thickness than said isolation insulator arranged in said memory cell region.

* * * * *